(12) United States Patent
Jang et al.

(10) Patent No.: US 10,777,449 B2
(45) Date of Patent: Sep. 15, 2020

(54) METHODS OF MANUFACTURING SEMICONDUCTOR DEVICES

(71) Applicant: SAMSUNG ELECTRONICS CO., LTD., Suwon-si, Gyeonggi-do (KR)

(72) Inventors: Sang-Shin Jang, Gwangyang-si (KR); Woo-Kyung You, Hwaseong-si (KR); Kyu-Hee Han, Hwaseong-si (KR); Jong-Min Baek, Seoul (KR); Viet Ha Nguyen, Yongin-si (KR); Byung-Hee Kim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/242,483

(22) Filed: Jan. 8, 2019

(65) Prior Publication Data

US 2019/0139813 A1     May 9, 2019

Related U.S. Application Data

(63) Continuation of application No. 15/616,334, filed on Jun. 7, 2017, now Pat. No. 10,199,263.

(30) Foreign Application Priority Data

Nov. 7, 2016    (KR) .................. 10-2016-0147324

(51) Int. Cl.
*H01L 21/768*    (2006.01)
*H01L 23/532*    (2006.01)
(Continued)

(52) U.S. Cl.
CPC .... *H01L 21/7682* (2013.01); *H01L 21/76816* (2013.01); *H01L 21/76834* (2013.01);
(Continued)

(58) Field of Classification Search
None
See application file for complete search history.

(56) References Cited

U.S. PATENT DOCUMENTS 8,298,911 B2    10/2012  Lee
8,456,009 B2    6/2013   Su et al.
(Continued)

FOREIGN PATENT DOCUMENTS

KR    10-2014-0099289 A    8/2014
KR    10-2016-0089146 A    7/2016

*Primary Examiner* — Long Pham
(74) *Attorney, Agent, or Firm* — Lee IP Law, P.C.

(57) ABSTRACT

A semiconductor device includes a first insulating interlayer on a first region of a substrate and a second insulating interlayer on a second region of the substrate, a plurality of first wiring structures on the first insulating interlayer, the first wiring structures being spaced apart from each other, a plurality of second wiring structures filling a plurality of trenches on the second insulating interlayer, respectively, an insulation capping structure selectively on a surface of the first insulating interlayer between the first wiring structures and on a sidewall and an upper surface of each of the first wiring structures, the insulation capping structure including an insulating material, a third insulating interlayer on the first and second wiring structures, and an air gap among the first wiring structures under the third insulating interlayer.

20 Claims, 20 Drawing Sheets

(51) Int. Cl.
  *H01L 23/522* (2006.01)
  *H01L 23/528* (2006.01)
(52) U.S. Cl.
  CPC .. *H01L 21/76843* (2013.01); *H01L 21/76877* (2013.01); *H01L 23/528* (2013.01); *H01L 23/5226* (2013.01); *H01L 23/5329* (2013.01); *H01L 23/53295* (2013.01); *H01L 21/76826* (2013.01); *H01L 21/76832* (2013.01); *H01L 21/76849* (2013.01); *H01L 23/53223* (2013.01); *H01L 23/53238* (2013.01); *H01L 23/53266* (2013.01)

(56) References Cited

U.S. PATENT DOCUMENTS

| | | |
|---|---|---|
| 8,896,120 B2 | 11/2014 | Clevenger et al. |
| 9,123,727 B2 * | 9/2015 | Fischer .............. H01L 21/7685 |
| 9,153,479 B2 | 10/2015 | Ting et al. |
| 9,390,967 B2 | 7/2016 | Lee et al. |
| 2008/0299758 A1 | 12/2008 | Harada et al. |
| 2015/0255275 A1 * | 9/2015 | Huang .............. H01L 21/76897 |
| | | 257/288 |
| 2016/0211211 A1 | 7/2016 | Yim et al. |

\* cited by examiner

METHODS OF MANUFACTURING SEMICONDUCTOR DEVICES

CROSS-REFERENCE TO RELATED APPLICATIONS

This is a continuation application based on pending application Ser. No. 15/616,334, filed Jun. 7, 2017, the entire contents of which is hereby incorporated by reference.

Korean Patent Application No. 10-2016-0147324, filed on Nov. 7, 2016 in the Korean Intellectual Property Office, and entitled: "Semiconductor Devices and Methods of Manufacturing the Same," is incorporated by reference herein in its entirety.

BACKGROUND

1. Field

Example embodiments relate to a semiconductor device and a method of manufacturing the same. More particularly, example embodiments relate to a semiconductor device including metal wiring structures and a method of manufacturing the same.

2. Description of the Related Art

In a semiconductor device, wiring structures including a metal may have a low resistance, and a gap between the wiring structures may be small. Thus, the parasitic capacitance between the wiring structures may increase, and an RC delay may be generated due to the parasitic capacitance. In order to decrease the parasitic capacitance, an air gap or an insulating interlayer having a low dielectric constant may be formed between the wiring structures.

SUMMARY

According to example embodiments, there is provided a semiconductor device. The semiconductor device includes a first insulating interlayer, a second insulating interlayer, a plurality of first wiring structures, a plurality of second wiring structures, an insulation capping structure, an insulation capping structure and a third insulating interlayer. The first insulating interlayer may be formed on a first region of a substrate and the second insulating interlayer may be formed on a second region of the substrate. The first wiring structures may be formed on the first insulating interlayer, and the first wiring structures may be spaced apart from each other. The second wiring structures may fill a plurality of trenches on the second insulating interlayer, respectively. The insulation capping structure may be selectively formed on a surface of the first insulating interlayer between the first wiring structures and a sidewall and an upper surface of each of the first wiring structures, and the insulation capping structure may include an insulating material. The third insulating interlayer may be formed on the first and second wiring structures. An air gap may be formed between the first wiring structures under the third insulating interlayer.

According to example embodiments, there is provided a semiconductor device. The semiconductor device includes a first insulating interlayer, a plurality of first wiring structures, an insulation capping structure, and a second insulating interlayer. The first insulating interlayer may be formed on a substrate. The first wiring structures may be formed on the first insulating interlayer. The first wiring structures may be spaced apart from each other. The insulation capping structure may be formed selectively on a surface of the first insulating interlayer between the first wiring structures and a sidewall and an upper surface of each of the first wiring structures. The insulation capping structure may include an insulating material. The second insulating interlayer may be formed on the first wiring structures. An air gap may be formed between the first wiring structures under the second insulating interlayer.

According to example embodiments, there is provided a method of manufacturing a semiconductor device. In the method, a preliminary first insulating interlayer may be formed on a first region and a second region of a substrate. The preliminary first insulating interlayer may include a plurality of trenches thereon. First and second wiring structures may be formed to fill the trenches on the first and second regions, respectively. A portion of the preliminary first insulating interlayer between the first wiring structures may be etched to form a first insulation interlayer between the first wiring structures and a second insulating interlayer between the second wiring structures. An insulation capping structure may be formed selectively on a surface of the first insulating interlayer between the first wiring structures and a sidewall and an upper surface of each of the first wiring structures. The insulation capping structure may include an insulating material. A third insulating interlayer may be formed on the first and second wiring structures. An air gap may be forming between the first wiring structures under the third insulating interlayer.

According to example embodiments, there is provided a semiconductor device, including a first insulating interlayer on a first region of a substrate and a second insulating interlayer on a second region of the substrate, a plurality of first wiring structures on the first insulating interlayer, the first wiring structures being spaced apart from each other, a plurality of second wiring structures filling a plurality of trenches on the second insulating interlayer, respectively, an insulation capping structure only on the first region of the substrate, the insulation capping structure covering a surface of the first insulating interlayer between adjacent first wiring structures and sidewalls and upper surfaces of the first wiring structures, the insulation capping structure including an insulating material, a third insulating interlayer on the first and second wiring structures, and an air gap among the first wiring structures under the third insulating interlayer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
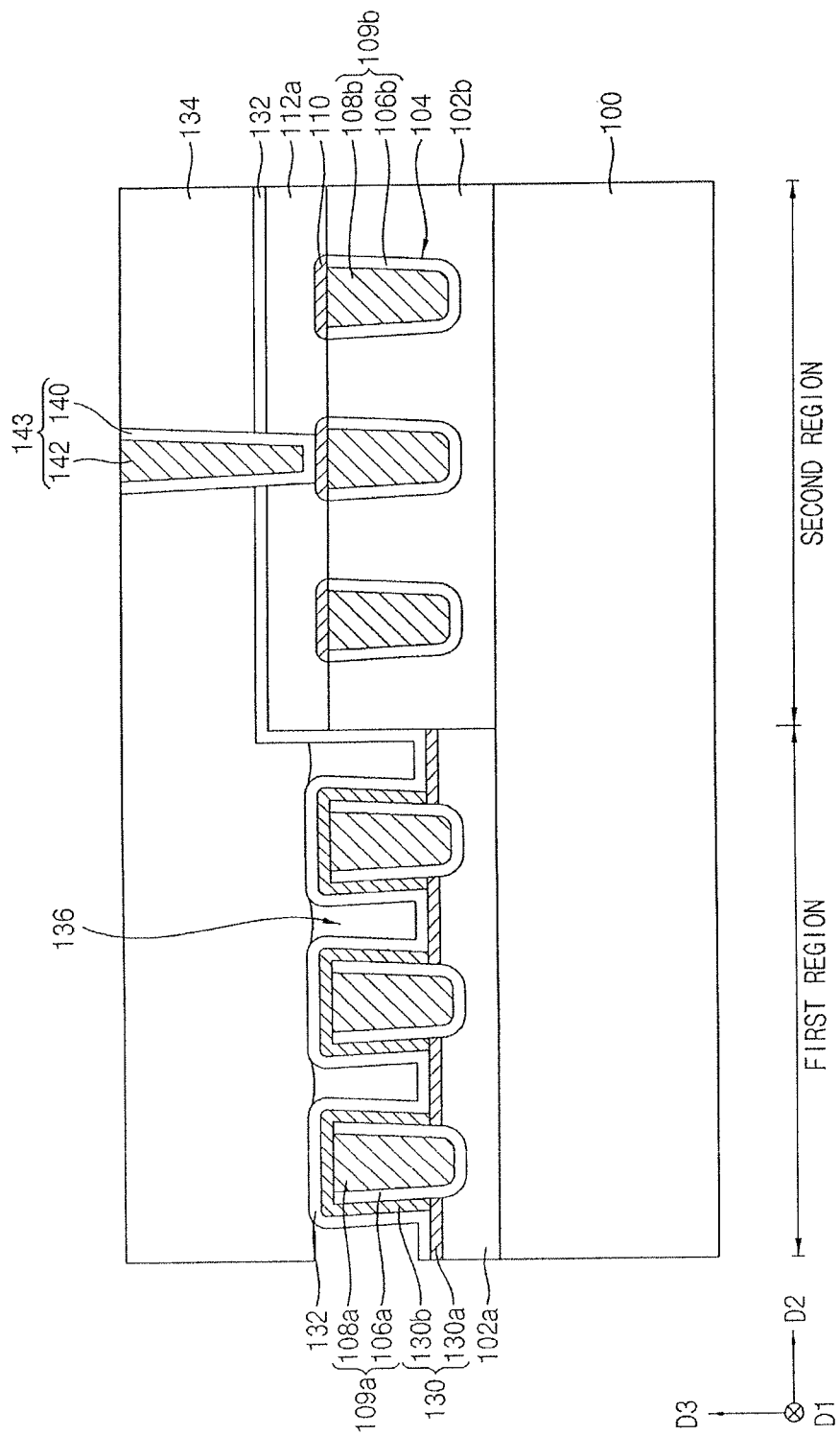
FIG. 1 illustrates a cross-sectional view of a semiconductor device in accordance with example embodiments.

FIG. 1 is a cross-sectional view illustrating a semiconductor device in accordance with example embodiments.

Referring to FIG. 1, the semiconductor device may include a first insulating interlayer 102a, a second insulating interlayer 102b, a third insulating interlayer 134, a first wiring structure 109a, and a second wiring structure 109b on a substrate 100. The semiconductor device may further include a first capping pattern 110 and an insulation capping structure 130.

The substrate 100 may include a semiconductor material, e.g., silicon, germanium, silicon-germanium, etc., or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

The substrate 100 may include first and second regions. The first region of the substrate 100 may include the first wiring structure 109a having an air gap at each of opposite sides thereof, and the second region of the substrate 100 may include the second wiring structure 109b having no air gap at opposite sides thereof.

The first insulating interlayer 102a may be formed on the first region of the substrate 100. The first insulating interlayer 102a may include a low-k material. For example, the first insulating interlayer 102a may include a low-k material having a dielectric constant lower than a dielectric constant of silicon nitride. In example embodiments, the low-k material may have a dielectric constant less than about 3.9, e.g., less than about 2.2. The low-k material may include a porous material, and the dielectric constant of the low-k material may be low due to pores therein. The low-k material may include, e.g., silicon oxide doped with carbon (SiCOH) or silicon oxide doped with fluorine (F—$SiO_2$), porous silicon oxide, spin on organic polymer, or an inorganic polymer, e.g., hydrogen silsesquioxane (HSSQ), methyl silsesquioxane (MSSQ), etc.

The second insulating interlayer 102b may be formed on the second region of the substrate 100. The second insulating interlayer 102b may include a material substantially the same as a material of the first insulating interlayer 102a. An upper surface of the second insulating interlayer 102b may be higher than an upper surface of the first insulating interlayer 102a relative to a bottom of the substrate 100.

A plurality of the first wiring structures 109a may be formed on the first insulating interlayer 102a. A lower surface of each of the first wiring structures 109a may be substantially coplanar with or lower than an upper surface of the first insulating interlayer 102a between the first wiring structures 109a, e.g., a portion of the first insulating interlayer 102a between two adjacent first wiring structures 109a may have an upper surface higher than a lower surface of the two adjacent first wiring structures 109a. Each of the first wiring structures 109a may extend in a first direction D1 with a predetermined height in a third direction D3, and the first wiring structures 109a may be spaced apart from each other in a second direction D2 substantially perpendicular to the first direction D1.

The second insulating interlayer 102b may include a plurality of trenches 104 thereon, e.g., therein, and the second wiring structures 109b may be formed in the trenches 104, respectively. Each of the second wiring structures 109b may extend in the first direction D1 with a predetermined height in the third direction D3, and the second wiring structures 109b may be spaced apart from each other in the second direction D2. The second insulating interlayer 102b may fill a gap between the second wiring structures 109b, e.g., the second insulating interlayer 102b may completely fill the gap between adjacent second wiring structures 109b along the entire height of the second wiring structures 109b in the third direction D3.

An upper surface of each of the second wiring structures 109b may be substantially coplanar with the upper surface of the second insulating interlayer 102b. For example, the upper surface of the first wiring structure 109a may be substantially coplanar with the upper surface of the second wiring structure 109b. In another example, if the first wiring structure 109a is slightly etched by an etching process, the upper surface of the first wiring structure 109a may be lower than the upper surface of the second wiring structure 109b.

The first wiring structure 109a may have a stacked structure including a first barrier pattern 106a and a first metal pattern 108a. The second wiring structure 109b may have a stacked structure including a second barrier pattern 106b and a second metal pattern 108b. The first and second barrier patterns 106a and 106b may include a metal, e.g., tantalum, titanium, molybdenum, ruthenium, cobalt, etc., and/or a metal nitride, e.g., tantalum nitride, titanium nitride, etc. The first and second metal patterns 108a and 108b may include a metal, e.g., copper, aluminum, tungsten, etc.

The first capping pattern 110 may be formed on the second wiring structure 109b. The first capping pattern 110 may not be formed on the first and second insulating interlayers 102a and 102b and the first wiring structure 109a, e.g., the first capping pattern 110 may be formed to directly contact and overlap only an upper surface of each of the second wiring structures 109b. The first capping pattern 110 may include a conductive material, e.g., cobalt.

A first capping mask 112a may cover the first capping pattern 110 and the second insulating interlayer 102b. The first capping mask 112a may include, e.g., SiCN, SiOC, SiN, SiOCN, etc.

The insulation capping structure 130 may be formed on surfaces of the first wiring structure 109a and the first insulating interlayer 102a. The insulation capping structure 130 may not be formed on the first capping mask 112a, e.g., the insulation capping structure 130 may not be formed in the second region of the substrate 100. The insulation capping structure 130 may include an insulating material.

The insulation capping structure 130 may include a second capping pattern 130a on the surface of the first insulating interlayer 102a and a third capping pattern 130b on the surface of the first wiring structure 109a. For example, as illustrated in FIG. 1, the second capping pattern 130a may be formed on portions of an upper surface of the first insulating interlayer 102a exposed between adjacent the first wiring structures 109a. For example, as illustrated in FIG. 1, the third capping pattern 130b may be formed on portions of exposed surfaces, e.g., upper surfaces and side surfaces protruding above the first insulating interlayer 102a, of the first wiring structures 109a. For example, as illustrated in FIG. 1, the insulation capping structure 130 may completely cover exposed surfaces of the first wiring structures 109a and completely cover the first insulating interlayer 102a exposed between adjacent ones of the first wiring structures 109a.

In example embodiments, the second capping pattern 130a may include oxygen and materials included in the third capping pattern 130b. In some example embodiments, a material of the second capping pattern 130a may be substantially the same as a material of the third capping pattern 130b. The insulation capping structure 130 may include a metal nitride, a metal oxide, or a metal oxynitride having an insulating property. In example embodiments, the insulation capping structure 130 may include an aluminum alloy, e.g., aluminum nitride, aluminum oxynitride, aluminum oxide, etc. In example embodiments, an aluminum nitride layer may be formed on the surface of the first wiring structure 109a, and an aluminum oxynitride layer may be formed on the surface of the first insulating interlayer 102a.

A liner layer 132 may be conformally formed on the insulation capping structure 130, the first capping mask 112a, and a sidewall of the second insulating interlayer 102b. The liner layer 132 may include, e.g., SiCN, SiOC, SiN, SiOCN, etc. In example embodiments, the liner layer 132 may include a material substantially the same as a material of the first capping mask 112a. Alternatively, the liner layer 132 may not be formed.

The third insulating interlayer 134 may be formed on the liner layer 132. A gap between the first wiring structures 109a may not be filled with the third insulating interlayer 134, which may be referred as an air gap 136. For example, as illustrated in FIG. 1, each first wiring structure 109a may be between two air gaps 136, so the plurality of the first wiring structures 109a may be between two air gaps 136.

The air gap 136 may be defined by the second and third capping patterns 130a and 130b and the third insulating interlayer 134 when the liner layer 132 is not formed. When the liner layer 132 is formed, the air gap 136 may be defined by the liner layer 132 and the third insulating interlayer 134.

A contact plug 143 may extend through the third insulating interlayer 134, the liner layer 132, and the first capping mask 112a, and may contact the first capping pattern 110 on the second wiring structure 109b. The contact plug 143 may be electrically connected with the second wiring structure 109b. In some example embodiments, the contact plug 143 may further extend through the first capping pattern 110, and may directly contact the second wiring structure 109b.

The contact plug 143 may have a stacked structure including a third barrier pattern 140 and a third metal pattern 142. In example embodiments, the third metal pattern 142 may include a material substantially the same as a material of each of the first and second metal patterns 108a and 108b.

The semiconductor device may include the first wiring structure 109a having the air gap 136 at each of the opposite sides thereof. Air may have a low dielectric constant of about 1, so that a parasitic capacitance between, e.g., among, the first wiring structures 109a may greatly decrease. Thus, the first wiring structure 109a may have a reduced RC delay, and may have a high performance.

The insulation capping structure 130 may be formed on the surface of the first wiring structure 109a, so that the migration and/or diffusion of the metal included in the first wiring structure 109a may be prevented by the insulation capping structure 130. The insulation capping structure 130 may be formed on the surface of the first insulating interlayer 102a, so that moisture from the first insulating interlayer 102a may be removed. Thus, a time dependent dielectric breakdown (TDDB) failure due to the moisture may decrease. Thus, the semiconductor device including the first wiring structure 109a may have a high reliability.

The semiconductor device may include the second wiring structures 109b, and the second insulating interlayer 102b including the low-k material may fill the gap between the second wiring structures 109b. The insulation capping structure 130 may not be formed on the second wiring structures 109b. Also, the contact plug 143 may be formed on the second wiring structures 109b having a structural stability higher than a structural stability of the first wiring structures 109a. The insulation capping structure 130 may not be formed on the second wiring structures 109b, so that a failure, e.g., the failure of the contact plug 143 to properly contact the first capping pattern 110, may decrease.

FIGS. 2 to 14 are cross-sectional views illustrating stages in a method of manufacturing a semiconductor device in accordance with example embodiments.

Figure 2:
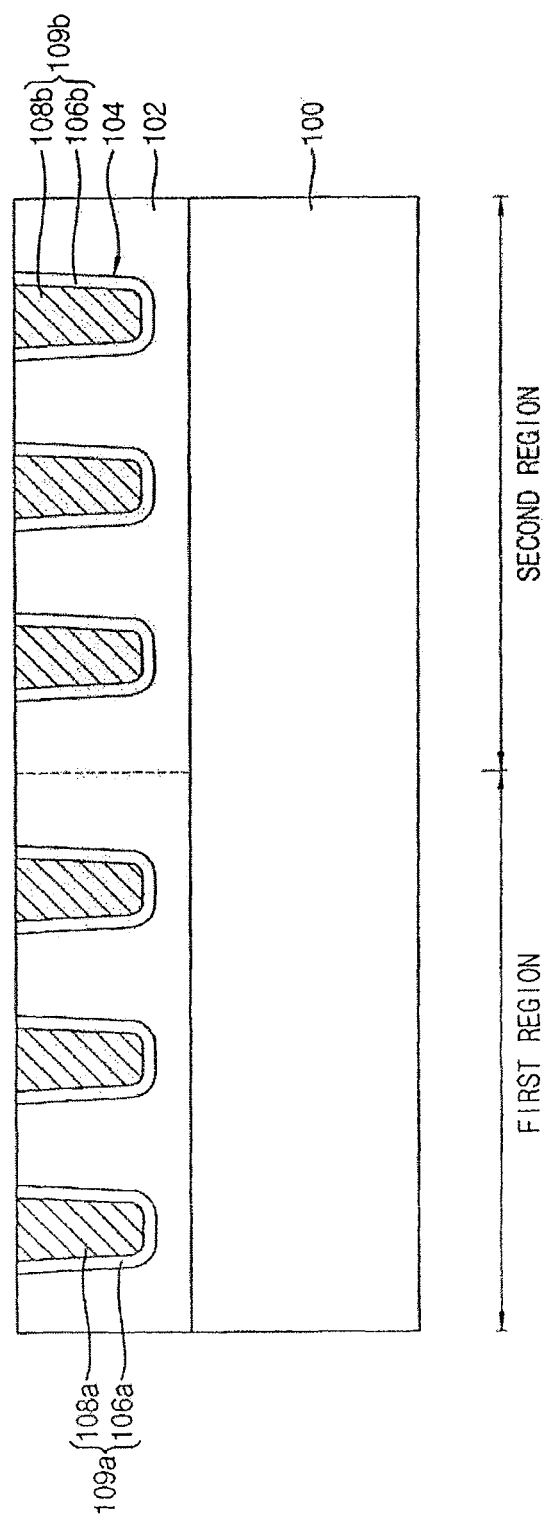
FIGS. 2 to 14 illustrate cross-sectional views of stages in a method of manufacturing a semiconductor device in accordance with example embodiments.

Referring to FIG. 2, the substrate 100 may include the first and second regions. A preliminary first insulating interlayer 102 may be formed on the substrate 100, and the preliminary first insulating interlayer 102 may be partially etched to form a plurality of trenches 104 thereon, e.g., therein. The plurality of first wiring structures 109a may be formed to fill the trenches 104 of the preliminary first insulating interlayer 102 in the first region of the substrate 100, respectively. Each of the first wiring structures 109a may include the first barrier pattern 106a and the first metal pattern 108a stacked. The plurality of second wiring structures 109b may be formed to fill the trenches 104 of the preliminary first insulating interlayer 102 in the second region of the substrate 100, respectively. Each of the second wiring structures 109b may include the second barrier pattern 106b and the second metal pattern 108b stacked.

The preliminary first insulating interlayer 102 may be formed of a low-k material. In example embodiments, the preliminary first insulating interlayer 102 may be formed of, e.g., silicon oxide doped with carbon (SiCOH) or silicon oxide doped with fluorine (F—SiO$_2$), a porous silicon oxide, spin on organic polymer, or an inorganic polymer, e.g., hydrogen silsesquioxane (HSSQ), methyl silsesquioxane (MSSQ), etc. The preliminary first insulating interlayer 102 may be formed by, e.g., a spin coating process, a chemical vapor deposition (CVD) process, or an atomic layer deposition (ALD) process.

The trenches 104 may be formed by forming an etching mask on the preliminary first insulating interlayer 102 and anisotropically etching the preliminary first insulating interlayer 102 using the etching mask. In example embodiments, each of the trenches 104 may extend in the first direction, and the trenches 104 may be spaced apart from each other in the second direction. The first and second wiring structures 109a and 109b may be formed in the trenches 104, e.g., the first and second wiring structures 109a and 109b may be formed simultaneously in the trenches 104 of the first and second regions of the substrate 100.

In detail, a barrier layer may be formed on an inner wall of the trenches 104 and an upper surface of the preliminary first insulating interlayer 102. The barrier layer may be formed of, e.g., a metal, e.g., tantalum, titanium, molybdenum, ruthenium, cobalt, etc., and/or a metal nitride, e.g., tantalum nitride, titanium nitride, etc. The barrier layer may be formed to have a single layer or a multi-layered structure. The barrier layer may be formed by, e.g., a CVD process, an ALD process, or a physical vapor deposition (PVD) process.

A metal layer may be formed on the barrier layer to fill the trenches 104. The metal layer may be formed of a metal, e.g., copper, aluminum, tungsten, etc. Hereinafter, only a case of the metal layer including copper will be illustrated.

A seed copper layer may be formed on the barrier layer. A metal layer including copper may be formed to completely fill the trenches 104 by an electroplating process. The seed copper layer may be formed by a PVD process using copper as a target material.

The metal layer and the barrier layer may be planarized until the upper surface of the preliminary first insulating interlayer 102 is exposed to form the first wiring structures 109a on the first region and the second wiring structures 109b on the second region. In example embodiments, the planarization process may be performed by a chemical mechanical polishing (CMP).

Figure 3:
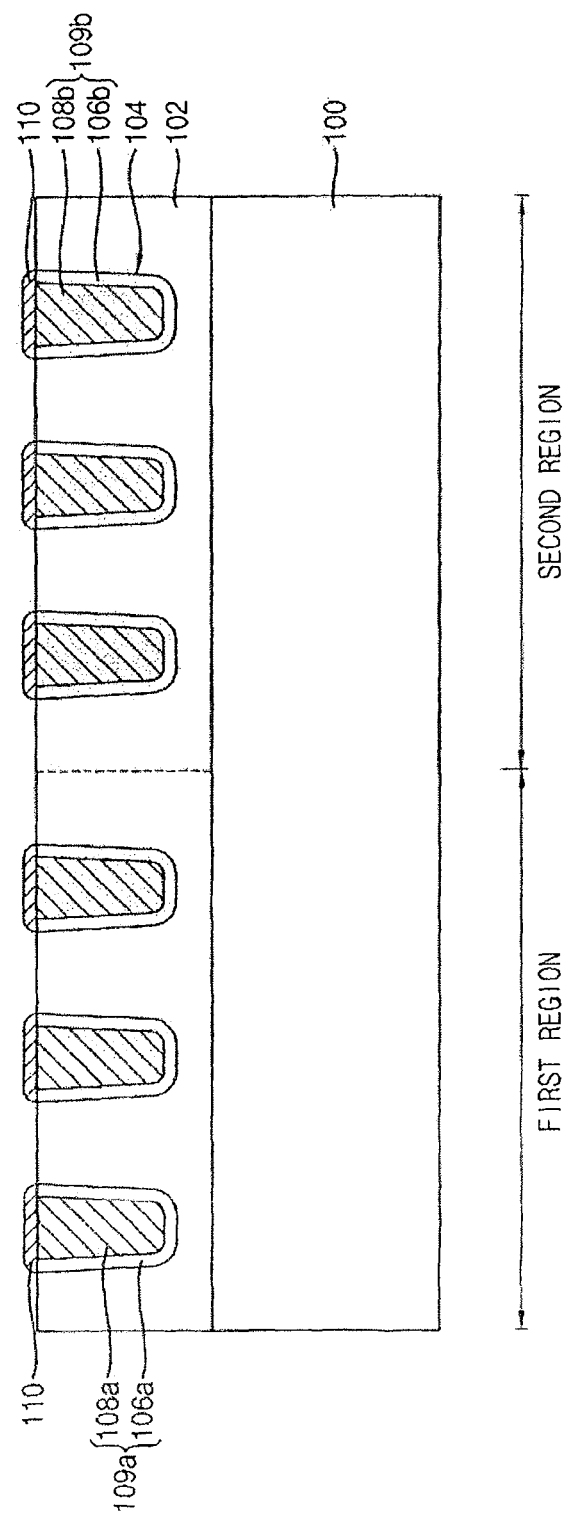

Referring to FIG. 3, the first capping pattern 110 may be selectively formed on the first and second wiring structures 109a and 109b. That is, the first capping pattern 110 may not be formed on the preliminary first insulating interlayer 102, e.g., the first capping pattern 110 may be formed only on top surfaces of the first and second wiring structures 109a and 109b without contacting the preliminary first insulating interlayer 102.

The first capping pattern 110 may be formed of a material that may be selectively deposited on a surface of a metal by a deposition process. Further, the first capping pattern 110 may be formed of a material that may not be deposited on a surface of silicon oxide by a deposition process.

The first capping pattern 110 may be formed of a conductive material. In example embodiments, the first capping pattern 110 may include, e.g., cobalt. In example embodiments, the first capping pattern 110 may be formed by a PVD process. The first capping pattern 110 may serve as a diffusion barrier layer of the metal included in the first wiring structures 109a. Also, in subsequent processes, moisture of the first wiring structures 109a may be prevented from being attached onto the first wiring structures 109a by the first capping pattern 110.

Figure 4:
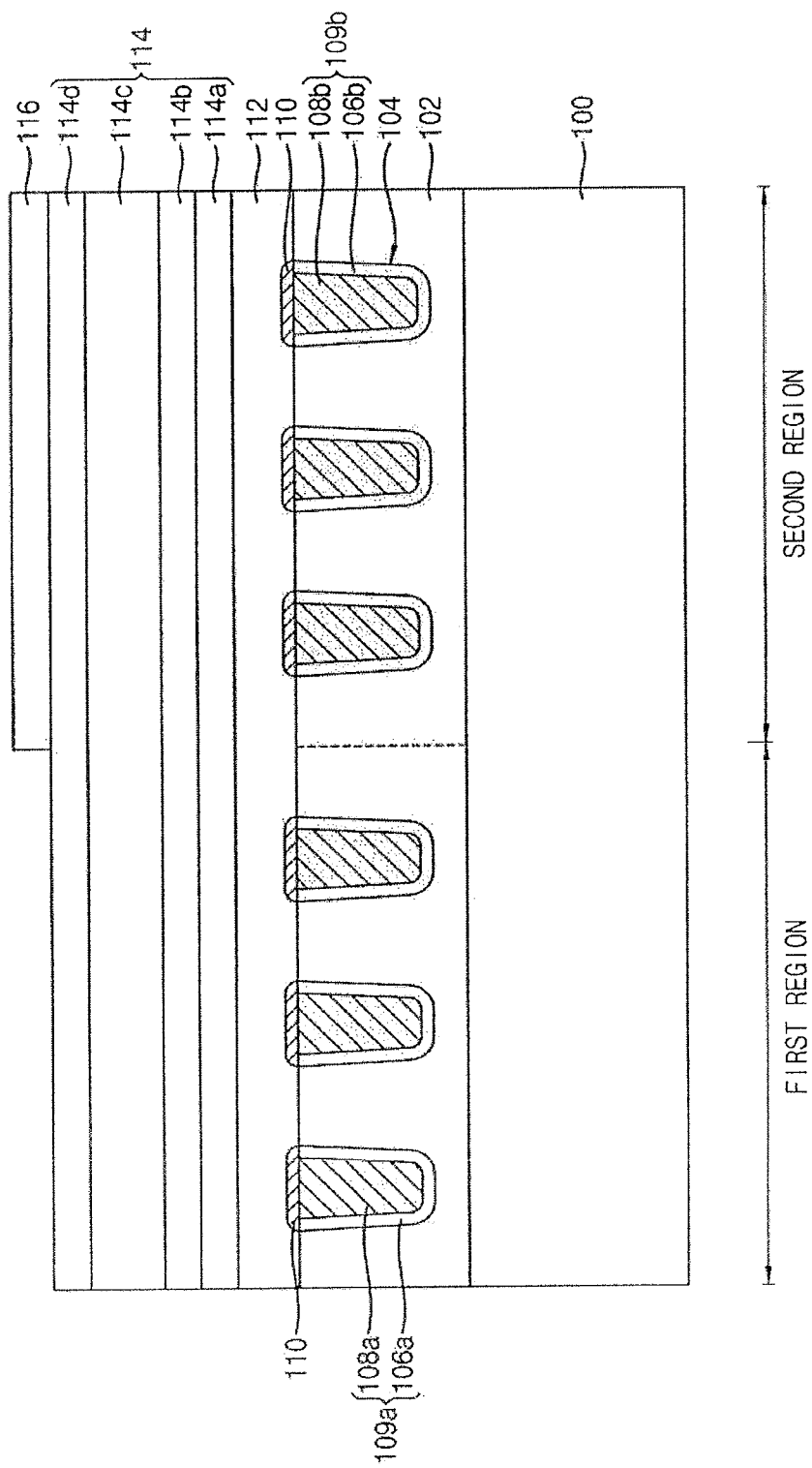

Referring to FIG. 4, the first capping mask layer 112 may be formed on the first capping pattern 110 and the preliminary first insulating interlayer 102. A mask structure 114 may be formed on the first capping mask layer 112. An etching mask 116 may be formed on the mask structure 114. The etching mask 116 may expose the mask structure 114 on the first region, and may cover the mask structure 114 on the second region.

The first capping mask layer 112 may serve as a mask for forming an air gap in a subsequent etching process. The first capping mask layer 112 may serve as a diffusion barrier layer of the metal included in the second wiring structures 109b. In subsequent processes, moisture of the first wiring structures 109a may be prevented from being attached onto the first wiring structures 109a by the first capping mask layer 112. The first capping mask layer 112 may be formed of, e.g., SiCN, SiOC, SiN, SiOCN, etc.

The mask structure 114 may serve as a mask for patterning the first capping mask layer 112 in subsequent processes. The mask structure 114 may be formed to have a stacked structure including a plurality of layers. In example embodiments, the mask structure 114 may include a titanium nitride layer 114a, a first silicon oxynitride layer 114b, a spin on hard mask layer 114c, and the second silicon oxynitride layer 114d sequentially stacked. The etching mask 116 may include a photoresist pattern.

Figure 5:
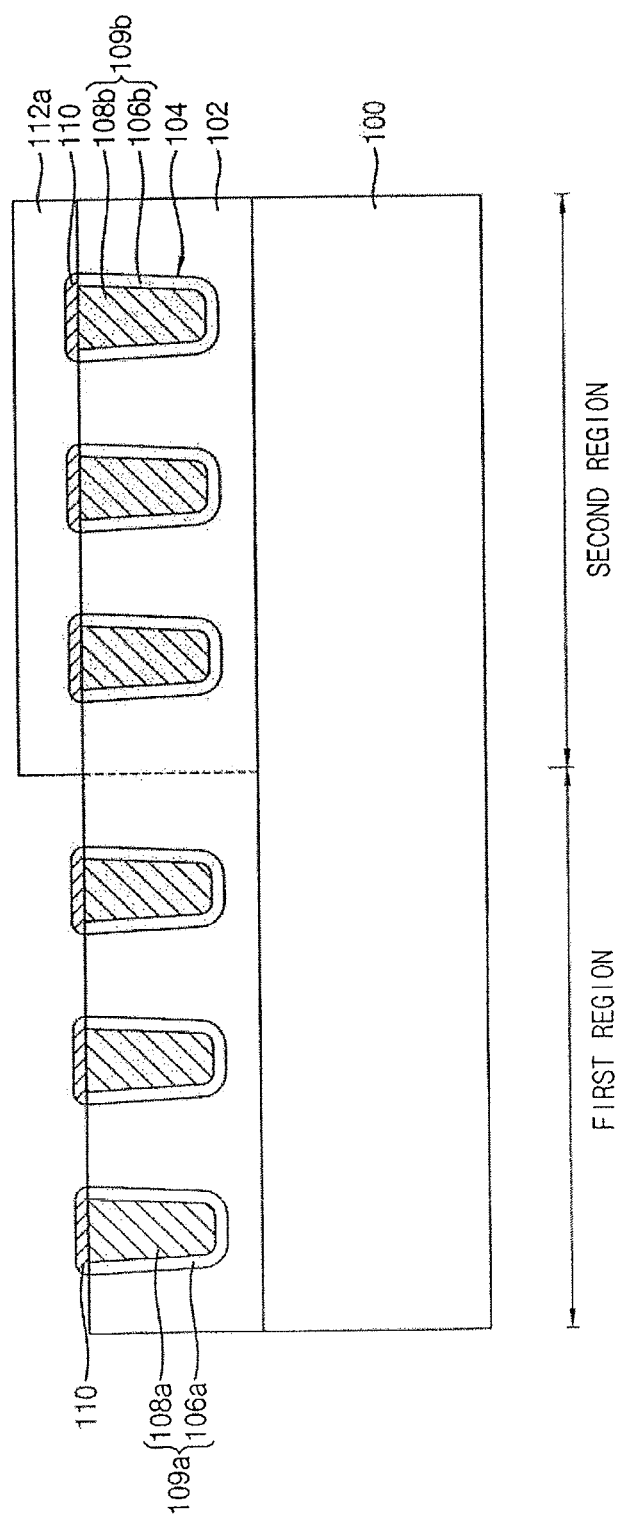

Referring to FIG. 5, the mask structure 114 may be sequentially etched using the etching mask 116. The first capping mask layer 112 may be etched to form the first capping mask 112a on the second region of the substrate 100.

The first capping mask 112a may cover the preliminary first insulating interlayer 102 and the first capping pattern 110 on the second region. Also, upper surfaces of the preliminary first insulating interlayer 102 and the first capping pattern 110 on the first region may be exposed by the first capping mask 112a. During the etching process, damages may be generated at the exposed upper surface of the preliminary first insulating interlayer 102 on the first region.

During the etching process, the etching mask 116 and the mask structure 114 on the second region may be also removed.

Figure 6:
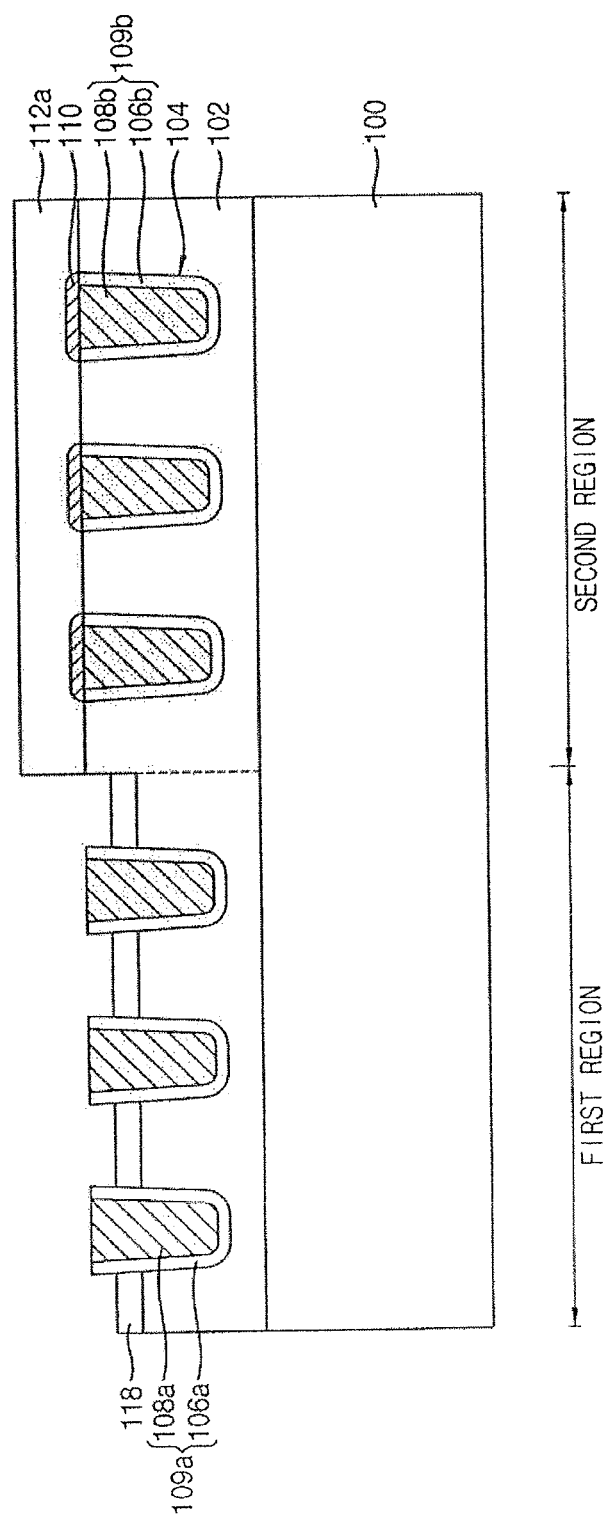

Referring to FIG. 6, the exposed upper surface of the preliminary first insulating interlayer 102 in the first region of the substrate 100 may be partially etched using the first capping mask 112a as an etching mask. The etching process may include a dry etching process using plasma. During the etching process, a first damaged portion 118 may be formed at an upper portion of the preliminary first insulating interlayer 102 on the first region.

Figure 7:
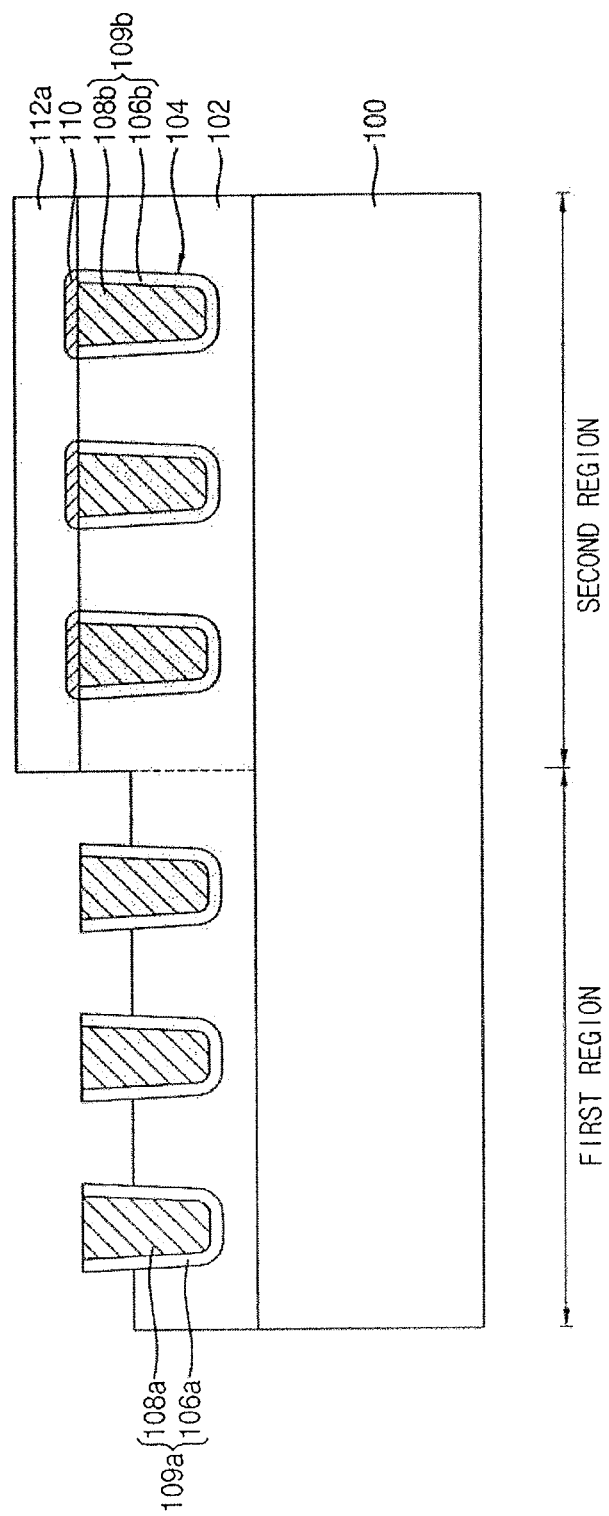

Referring to FIG. 7, the exposed upper surface of the preliminary first insulating interlayer 102 in the first region may be wet etched by a predetermined thickness using the first capping mask 112a as an etching mask. In example embodiments, the first damaged portion 118 in the preliminary first insulating interlayer 102 may be completely removed by the etching process. In example embodiments, an etchant may include hydrofluoric acid (HF) in the wet etching process. During the dry etching process and the wet etching process, the first capping pattern 110 on the first wiring structure 109a may be partially or completely removed.

Figure 8:
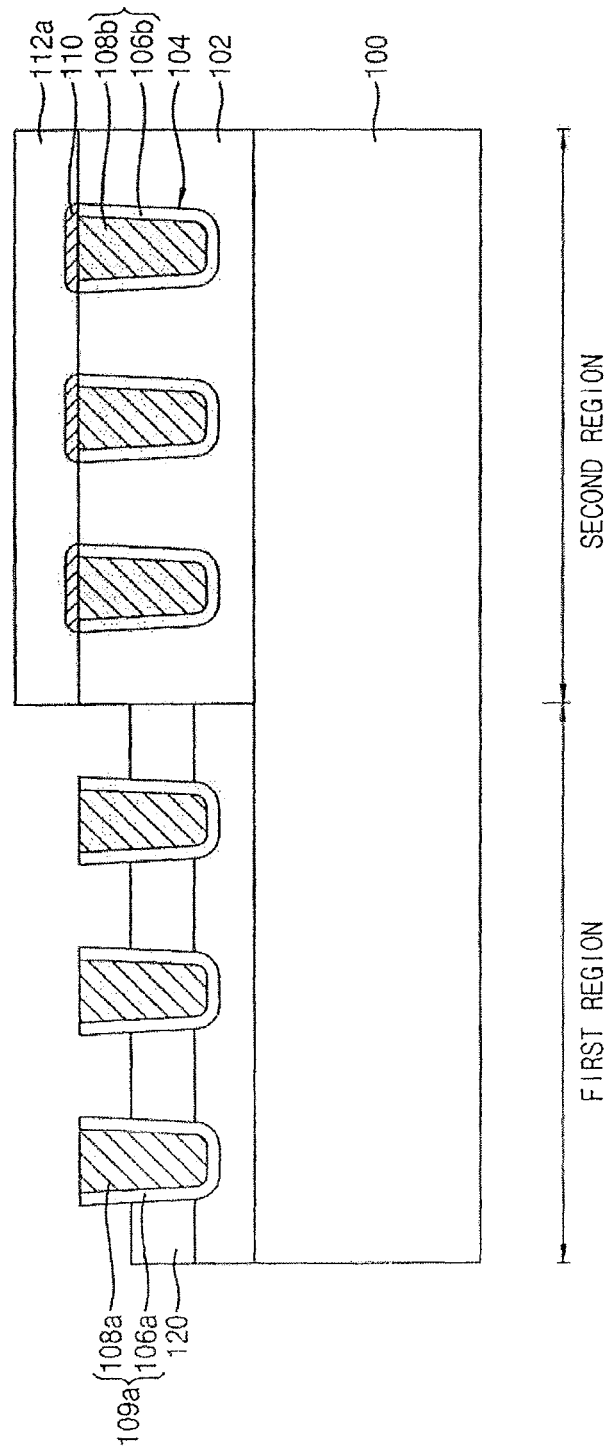

Referring to FIG. 8, a plasma treatment may be performed on the preliminary first insulating interlayer 102 on the first region, so that a second damaged portion 120 may be formed at an upper portion of the preliminary first insulating interlayer 102 on the first region. The second damaged portion 120 may define an air gap subsequently formed, e.g., an upper portion of the first preliminary insulating interlayer 102 on the first region may be plasma treated to define a depth of a subsequently formed air gap. Thus, a lower surface of the second damaged portion 120 may be substantially coplanar with or higher than a lower surface of the first wiring structure 109a.

In a subsequent etching process, an etch rate of the second damaged portion 120 of the preliminary first insulating interlayer 102 may be higher than an etch rate of other portions of the preliminary first insulating interlayer 102. In example embodiments, the plasma treatment may use gas, e.g., NH3.

Figure 9:
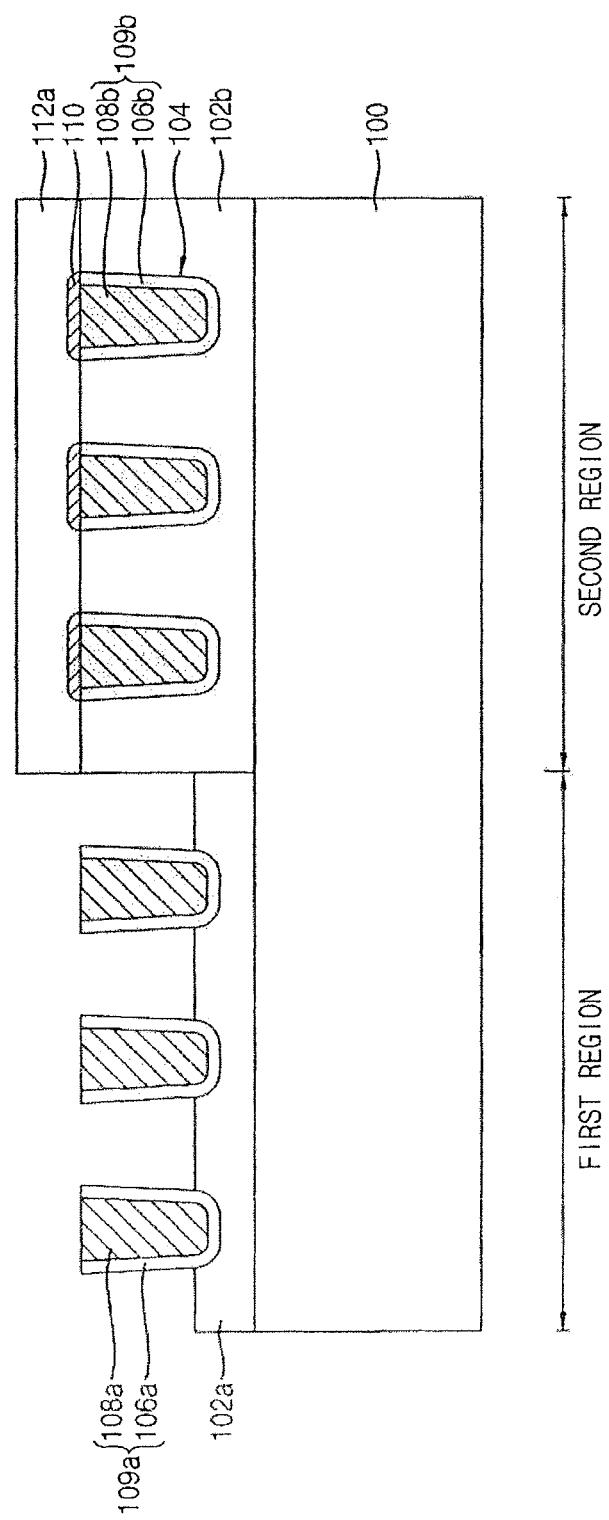

Referring to FIG. 9, the second damaged portion 120 may be removed by a wet etching process. In example embodiments, an etchant may include hydrofluoric acid (HF) in the wet etching process. Spaces adjacent to the first wiring structures 109a defined by the removed second damaged portion 120 define the subsequently formed air gaps.

The preliminary first insulating interlayer 102 between the first wiring structures 109a on the first region may be removed by the etching process to form the first insulating interlayer 102a on the first region. Thus, a gap may be formed between, e.g., among, the first wiring structures 109a. However, the preliminary first insulating interlayer 102 between the second wiring structures 109b on the second region may remain, and thus may be referred to as the second insulating interlayer 102b. That is, the second insulating interlayer 102b may fill the gaps between the second wiring structures 109b.

In the wet etching process, the second damaged portion 120 may be rapidly and selectively etched. As the second damaged portion 120 may be formed in a previous process, the second damaged portion 120 may be accurately etched by the etching process to form an air gap having a target depth.

During the wet etching process, the first capping pattern 110 on the first wiring structure 109a may be completely removed, and thus an upper surface of the first wiring structure 109a may be exposed. However, the first capping mask 112a may cover the first capping pattern 110 and the second insulating interlayer 102b on the second region, so that the first capping pattern 110 may remain on the second wiring structure 109b after the dry etching process and the wet etching process.

Alternatively, the preliminary first insulating interlayer 102 may be etched by a dry etching process. That is, the preliminary first insulating interlayer 102 shown in FIG. 5 may be formed, and then the preliminary first insulating interlayer 102 may be etched by the dry etching process using plasma to form a structure shown in FIG. 9.

Figure 10:
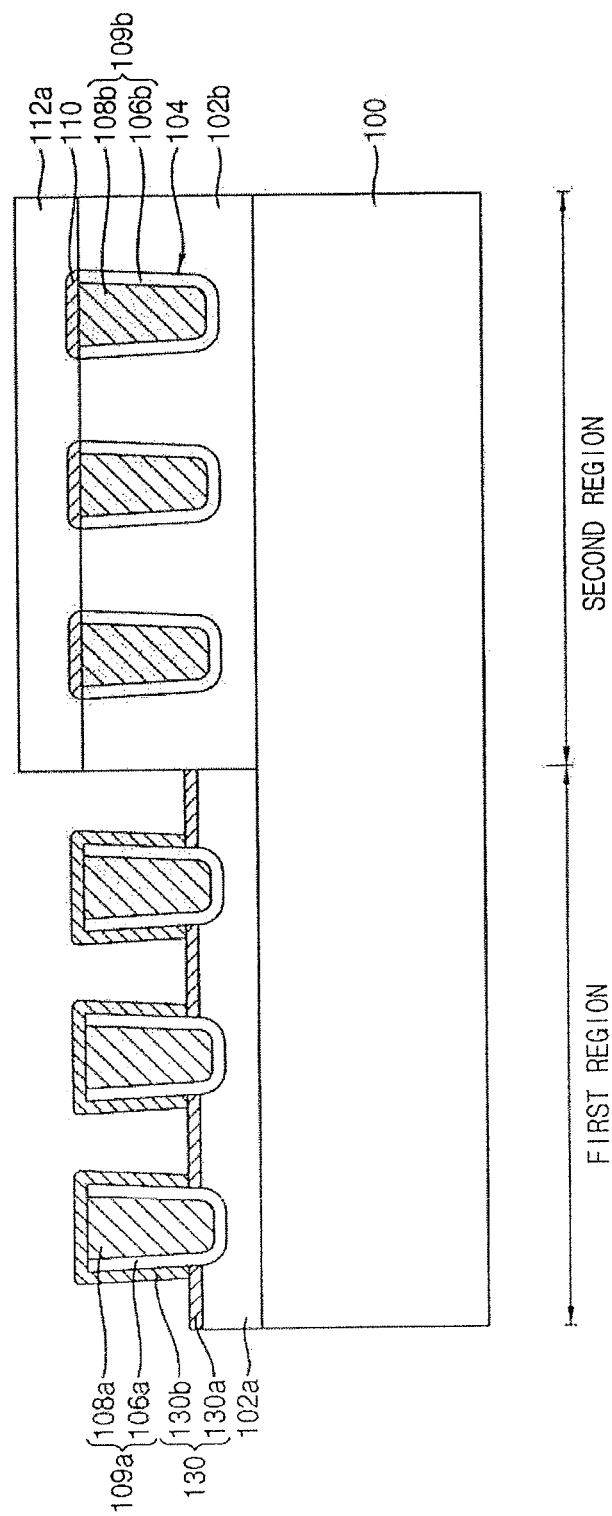

Referring to FIG. 10, the insulation capping structure 130 may be selectively formed on surfaces of the first wiring structure 109a and the first insulating interlayer 102a. That is, the insulation capping structure 130 may not be formed on the first capping mask 112a on the second region. The insulation capping structure 130 may be conformally formed on the first wiring structure 109a and the first insulating interlayer 102a.

The insulation capping structure 130 may include an insulation material. In example embodiments, the insulation capping structure 130 may be formed to have a, e.g., uniform, thickness of about 0.1 nm to about 10 nm.

The insulation capping structure 130 may include the second capping pattern 130a on the surface of the first insulating interlayer 102a and the third capping pattern 130b on the surface of the first wiring structure 109a. The second and third capping patterns 130a and 130b may be connected with each other to have a liner shape. In example embodiments, the second capping pattern 130a may include oxygen and materials included in the third capping pattern 130b. In example embodiments, the second capping pattern 130a may include a material substantially the same as a material of the third capping pattern 130b.

The insulation capping structure 130 may be formed of a material that may be selectively deposited on a surface of a metal and silicon oxide by a deposition process. Also, the insulation capping structure 130 may by formed of a material that may not be deposited on a surface of, e.g., SiCN, SiOC, SiN, SiOCN, by a deposition process.

The insulation capping structure 130 may include a metal nitride, a metal oxide or a metal oxynitride having an insulating property. In example embodiments, the insulation capping structure 130 may be formed of an aluminum alloy, e.g., aluminum nitride, aluminum oxynitride, aluminum oxide, etc.

The insulation capping structure 130 may be formed by a CVD process or an ALD process at a temperature of about 250° C. to about 450° C. For example, an aluminum source gas and a nitrogen source gas may be used in a CVD process or an ALD process for forming the insulation capping structure 130. In this case, an aluminum nitride layer, e.g., via aluminum and nitrogen gases, may be formed on the surface of the first wiring structure 109a, e.g., on a surface of a metal, and an aluminum oxynitride layer, e.g., via the same aluminum and nitrogen gases, may be formed on the surface of the first insulating interlayer 102a, e.g., on a surface of silicon oxide.

As the insulation capping structure 130 is formed on the surface of the first wiring structure 109a, the migration and/or diffusion of the metal included in the first wiring structure 109a may be prevented, e.g., deterioration of the metal included in the first wiring structure 109a during subsequent processes may be prevented. Further, as the insulation capping structure 130 is formed on the surface of the first insulating interlayer 102a, moisture in the first insulating interlayer 102a may be removed. Thus, a TDDB failure due to the moisture may decrease. Thus, the semiconductor device including the first wiring structure 109a may have a high reliability.

If the insulation capping structure 130 were to be formed on the surface of the first capping mask 112a on the second region, in addition to the first region, the insulation capping structure 130 could not have been be easily removed by a subsequent etching process for forming a contact plug. Thus, a contact plug through the first capping mask 112a for contacting the second wiring structure 109b could have exhibited a contact failure, e.g., in which the contact plug would not have contacted the first capping pattern 110. In contrast, in example embodiments, the insulation capping structure 130 is selectively formed only on the first region, i.e., may not be formed on the first capping mask 112a in the second region, so that the failure in which the contact plug does not contact the first capping pattern 110 may be decreased.

Figure 11:
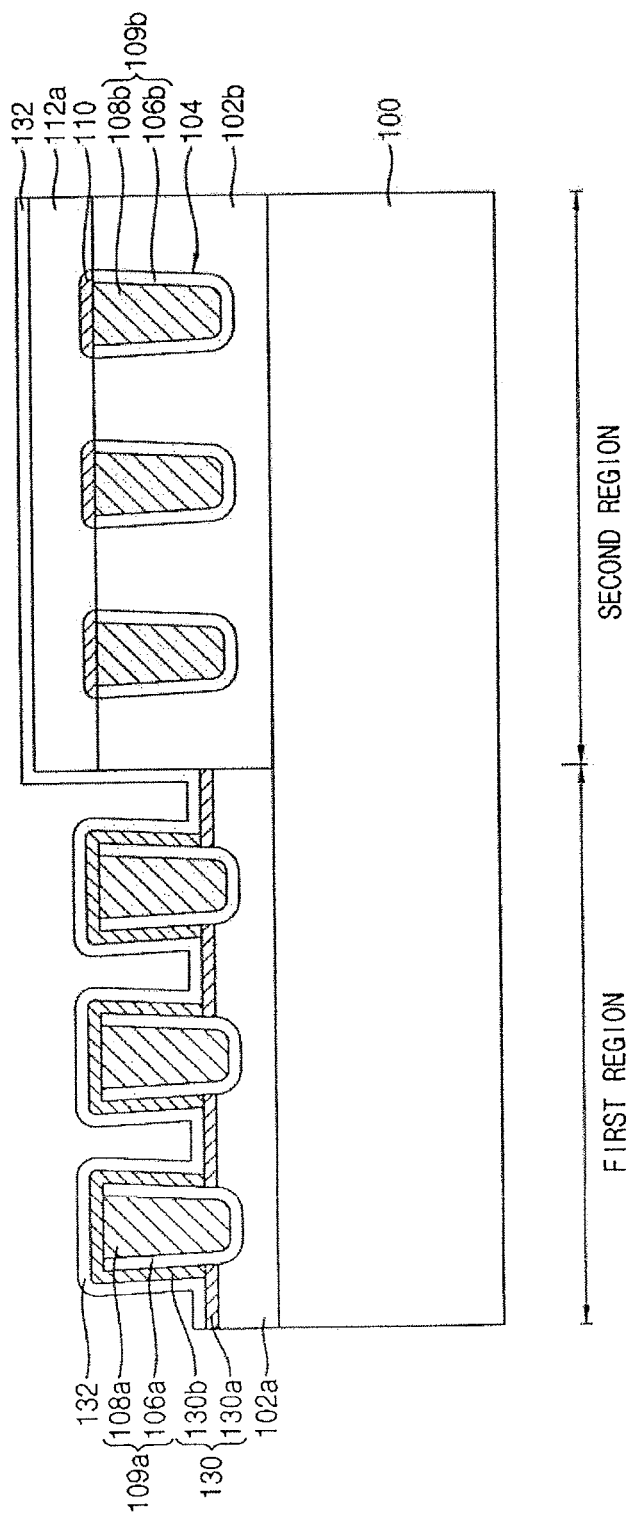

Referring to FIG. 11, the liner layer 132 may be conformally formed on the insulation capping structure 130, the first capping mask 112a, and a sidewall of the second insulating interlayer 102b. The liner layer 132 may be formed by a CVD process or an ALD process. The liner layer 132 may be formed of, e.g., SiCN, SiOC, SiN, SiOCN, etc. In example embodiments, the liner layer 132 may have a material substantially the same as a material of the first capping mask 112a. Alternatively, the liner layer 132 may not be formed.

Figure 12:
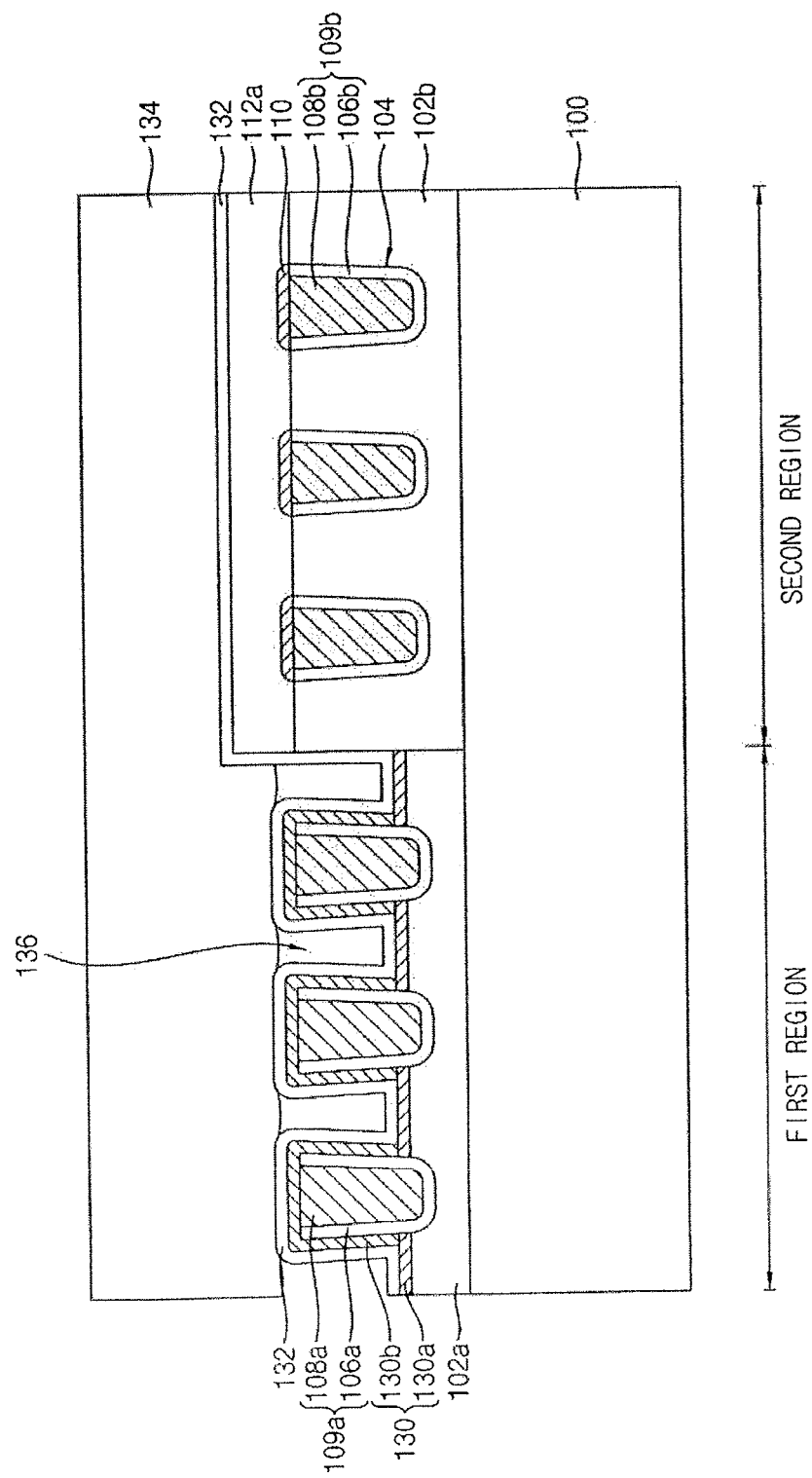

Referring to FIG. 12, the third insulating interlayer 134 may be formed on the liner layer 132. The third insulating interlayer 134 may be formed by a deposition process having a poor step coverage characteristic. The third insulating interlayer 134 may not fill the gap between the first wiring structures 109a, so that the air gap 136 may be formed between, e.g., among, the first wiring structures 109a. However, the second insulating interlayer 102b may be formed to fill the gap between, e.g., among, the second wiring structures 109b. Thus, no air gap may be formed between the second wiring structures 109b.

The third insulating interlayer 134 may be formed of a low-k material, e.g., silicon oxide doped with carbon (Si-COH) or silicon oxide doped with fluorine (F—$SiO_2$), a porous silicon oxide, spin on organic polymer, or an inorganic polymer, e.g., hydrogen silsesquioxane (HSSQ), methyl silsesquioxane (MSSQ), etc. In example embodiments, the third insulating interlayer 134 may include a material substantially the same as materials of first and second insulating interlayers 102a and 102b.

Figure 13:
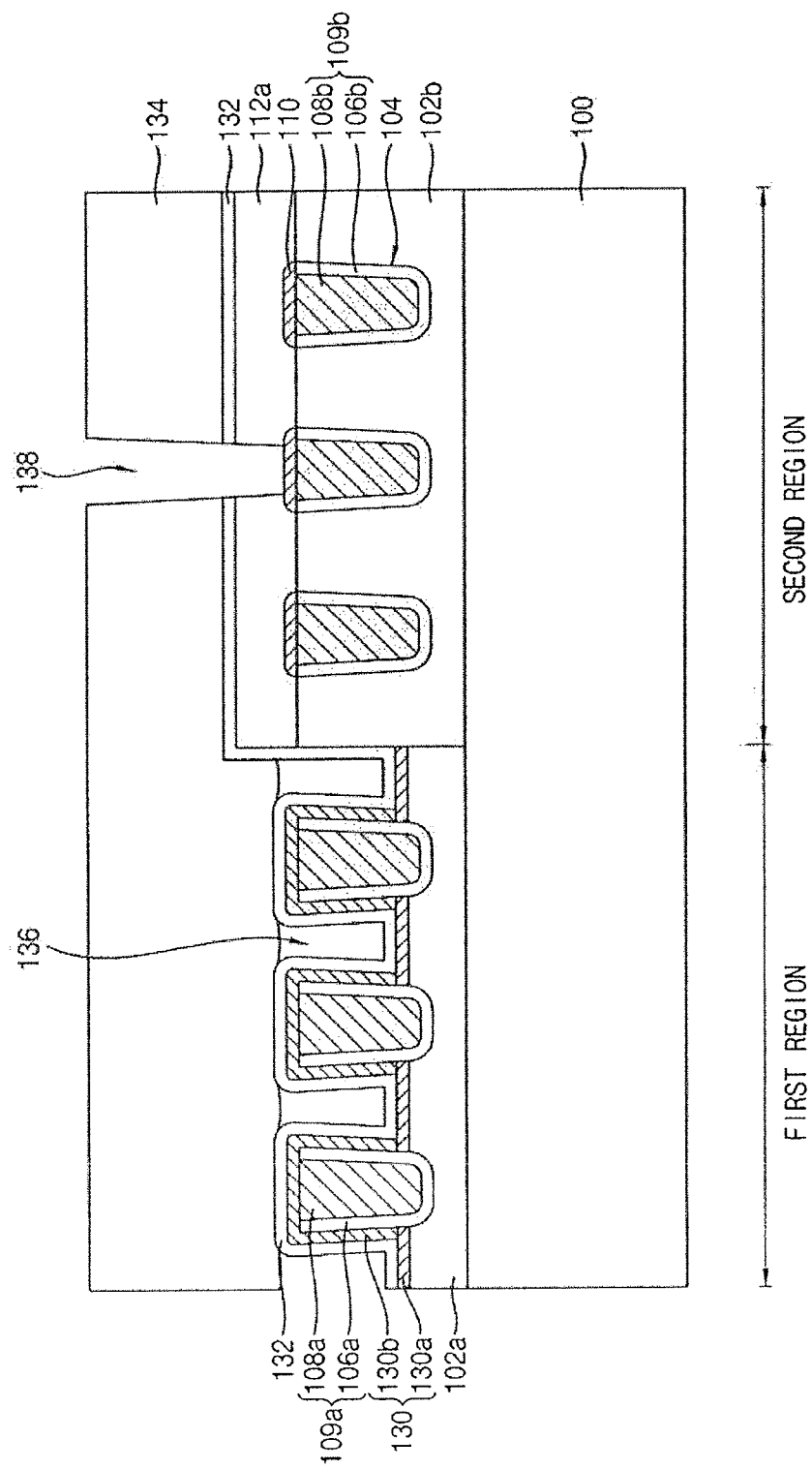

Referring to FIG. 13, the third insulating interlayer 134, the liner layer 132, and the first capping mask 112a may be etched to form a contact hole 138 exposing the first capping pattern 110 formed on the upper surface of the second wiring structure 109b. In some example embodiments, the first capping pattern 110 may be also etched, during the etching process for forming the contact hole 138. In this case, the contact hole 138 may expose the upper surface of the second wiring structure 109b.

The first wiring structure 109a having the air gap 136 at each of opposite sides thereof may have a stability lower than a stability of the second wiring structure 109b having no air gap at opposite sides thereof. Thus, preferably, the contact hole 138 may be formed on the second wiring structure 109b. As described above, the insulation capping structure 130 may not be formed on the upper surface of the first capping mask 112a, so that the contact hole 138 may be easily formed.

Figure 14:
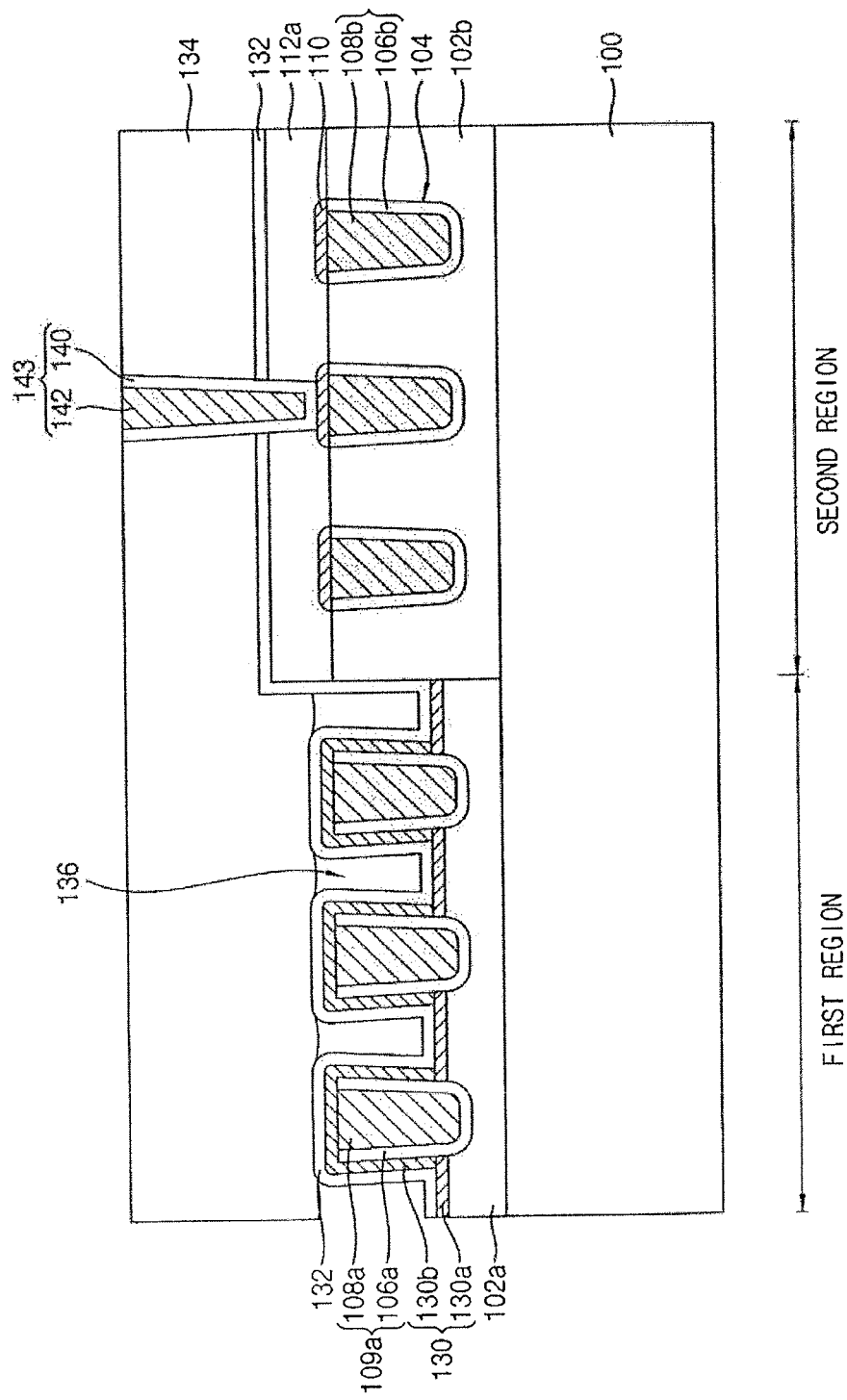

Referring to FIG. 14, a conductive material may fill the contact hole 138 to form the contact plug 143. The conductive material may include a metal.

In example embodiments, the contact plug 143 may have a stacked structure including a third barrier pattern 140 and a third metal pattern 142. In detail, a barrier layer may be formed on the third insulating interlayer 134 and a sidewall and a bottom of the contact hole 138. A metal layer may be formed on the barrier layer to sufficiently fill the contact hole 138. The metal layer and the barrier layer may be planarized until an upper surface of the third insulating interlayer 134 is exposed to form the contact plug 143 including the third barrier pattern 140 and the third metal pattern 142. In example embodiments, the third metal pattern 142 may include a material substantially the same as materials of the first and the second metal patterns 108a and 108b. As described above, the semiconductor device including a plurality of wiring structures may be manufactured.

Figure 15:
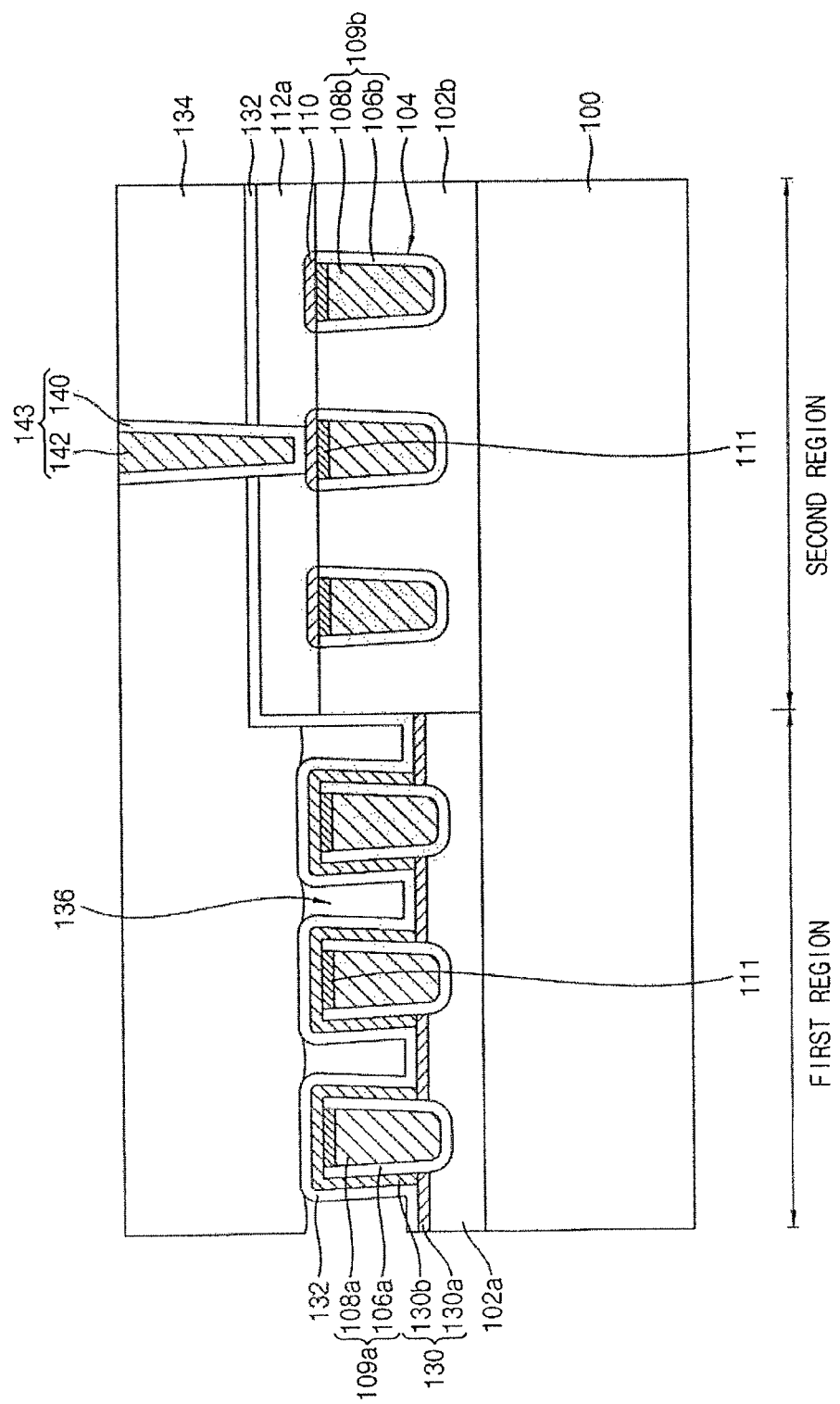
FIG. 15 illustrates a cross-sectional view of a semiconductor device in accordance with example embodiments.

FIG. 15 is a cross-sectional view illustrating a semiconductor device in accordance with example embodiments.

The semiconductor device may be substantially the same as or similar to that of FIG. 1, except for upper capping patterns on the first and second wiring structures. Thus, like reference numerals refer to like elements, and detailed descriptions thereof are omitted herein.

Referring to FIG. 15, an upper capping pattern 111 may be formed on the first and second wiring structures 109a and 109b.

The first wiring structure 109a may include the first barrier pattern 106a and the first metal pattern 108a, and the second wiring structure 109b may include the second barrier pattern 106b and the second metal pattern 108b. In example embodiments, the first and second metal patterns 108a and 108b may include, e.g., copper. The upper capping pattern 111 may be formed on upper surfaces of the first and second metal patterns 108a and 108b within the trenches 104, In example embodiments, the upper capping pattern 111 may include manganese. The upper capping pattern 111 may further include a very small amount of copper.

The upper capping pattern 111 may be formed on the first and the second metal patterns 108a and 108b, and may contact the first and second barrier patterns 106a and 106b. That is, the upper capping pattern 111 may be formed between an upper surface of the first metal pattern 108a and the insulation capping structure 130, and may be formed between an upper surface of the second metal pattern and the first capping pattern 110.

In example embodiments, an upper surface of each of the first and second metal patterns 108a and 108b may be lower than an upper surface of the second insulating interlayer 102b. The upper capping pattern 111 may be formed in each of the trenches 104 of the second insulating interlayer 102b. In example embodiments, the upper surface of an upper capping pattern 111 may be substantially coplanar with the upper surface of the second insulating interlayer 102b.

In some example embodiments, the upper capping pattern 111 may surround surfaces of the first and second metal patterns 108a and 108b. In this case, the upper capping pattern 111 may be formed on the upper surface of the first metal pattern 108a and between the first barrier pattern 106a and a sidewall and a lower surface of the first metal pattern 108a, and may be formed on the upper surface of the second metal pattern 108b and between the second barrier pattern 106b and a sidewall and a lower surface of the second metal pattern 108b. The diffusion of the copper included in the first and second metal patterns 108a and 108b may be prevented by the upper capping pattern 111.

Figure 16:
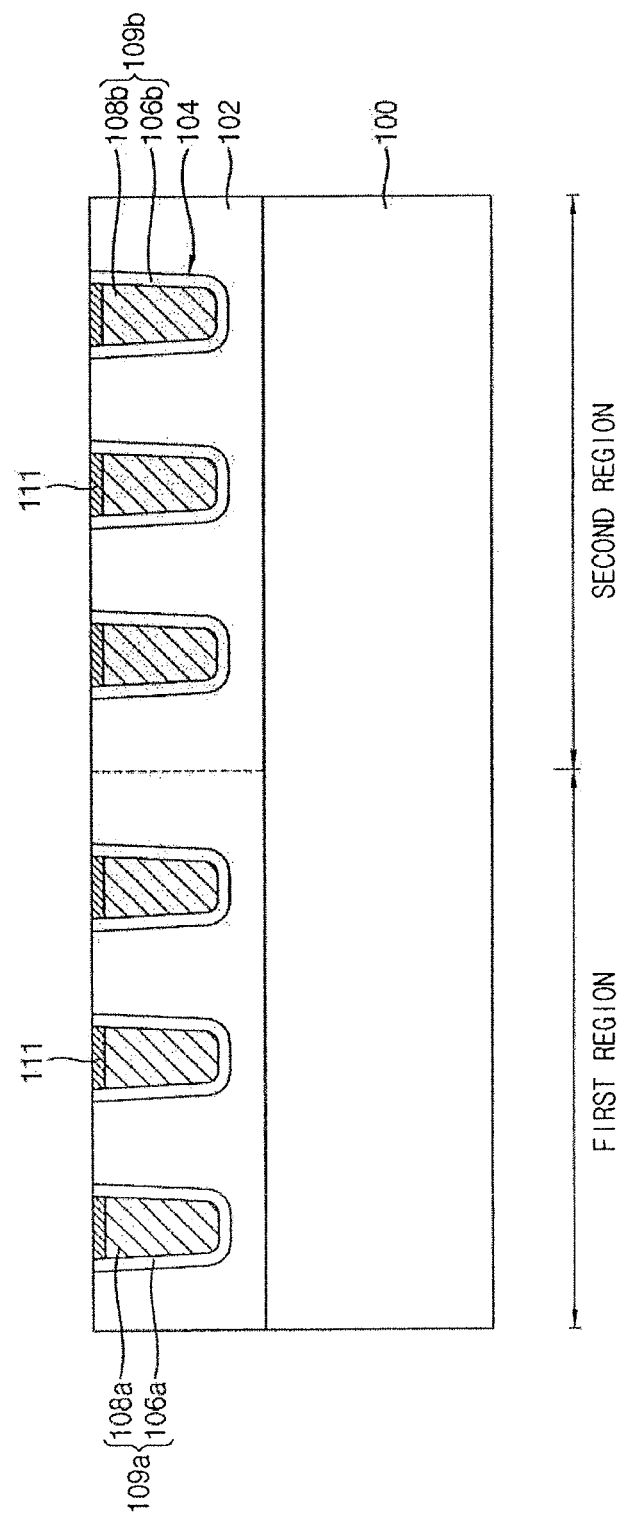
FIG. 16 illustrates a cross-sectional view of a stage in a method of manufacturing a semiconductor device in accordance with example embodiments.

FIG. 16 is a cross-sectional view illustrating a stage in a method of manufacturing a semiconductor device in accordance with example embodiments. This method includes processes substantially the same as or similar to those illustrated with reference to FIGS. 2 to 14. However, in the process for forming the first and second wiring structures, the upper capping pattern may be also formed.

First, the process illustrated with reference to FIG. 2 may be performed. That is, the preliminary first insulating interlayer 102 may be formed on the substrate 100, and the preliminary first insulating interlayer 102 may be anisotropically etched to form the trenches 104 thereon. The barrier layer may be formed on an inner wall of the trenches 104 and an upper surface of the preliminary first insulating interlayer 102.

Referring to FIG. 16, a seed copper layer may be formed on the barrier layer. A preliminary copper layer may be formed on the seed copper layer to fill the trenches 104 by an electroplating process. The electroplating process may be performed using an electrolyte solution including copper ions, a very small amount of manganese ions, and an additive. In example embodiments, a copper source in the electrolyte solution may include copper alkylsulfonate, e.g., copper sulfonate, methanesulfonate, and the like. The preliminary copper layer may include copper and a very small amount of manganese.

The preliminary copper layer may be annealed. The annealing process may be performed at a temperature of about 200° C. to about 450° C. Atoms of the manganese in the preliminary copper layer may be migrated into an upper portion of the preliminary copper layer, so that the preliminary copper layer may be transformed into a copper layer and an upper capping layer covering an upper surface of the copper layer. The upper capping layer may include manganese.

The copper layer, the upper capping layer, and the barrier layer may be planarized until an upper surface of the preliminary first insulating interlayer 102 may be exposed. Thus, the first barrier pattern 106a, the first metal pattern 108a, and the upper capping pattern 111 may be formed in each of the trenches 104 on the first region, and the second barrier pattern 106b, the second metal pattern 108b, and the upper capping pattern 111 may be formed in each of the trenches 104 on the second region.

Then, processes substantially the same as or similar to those illustrated with reference to FIGS. 3 to 14 may be performed to form the semiconductor device shown in FIG. 15.

Figure 17:
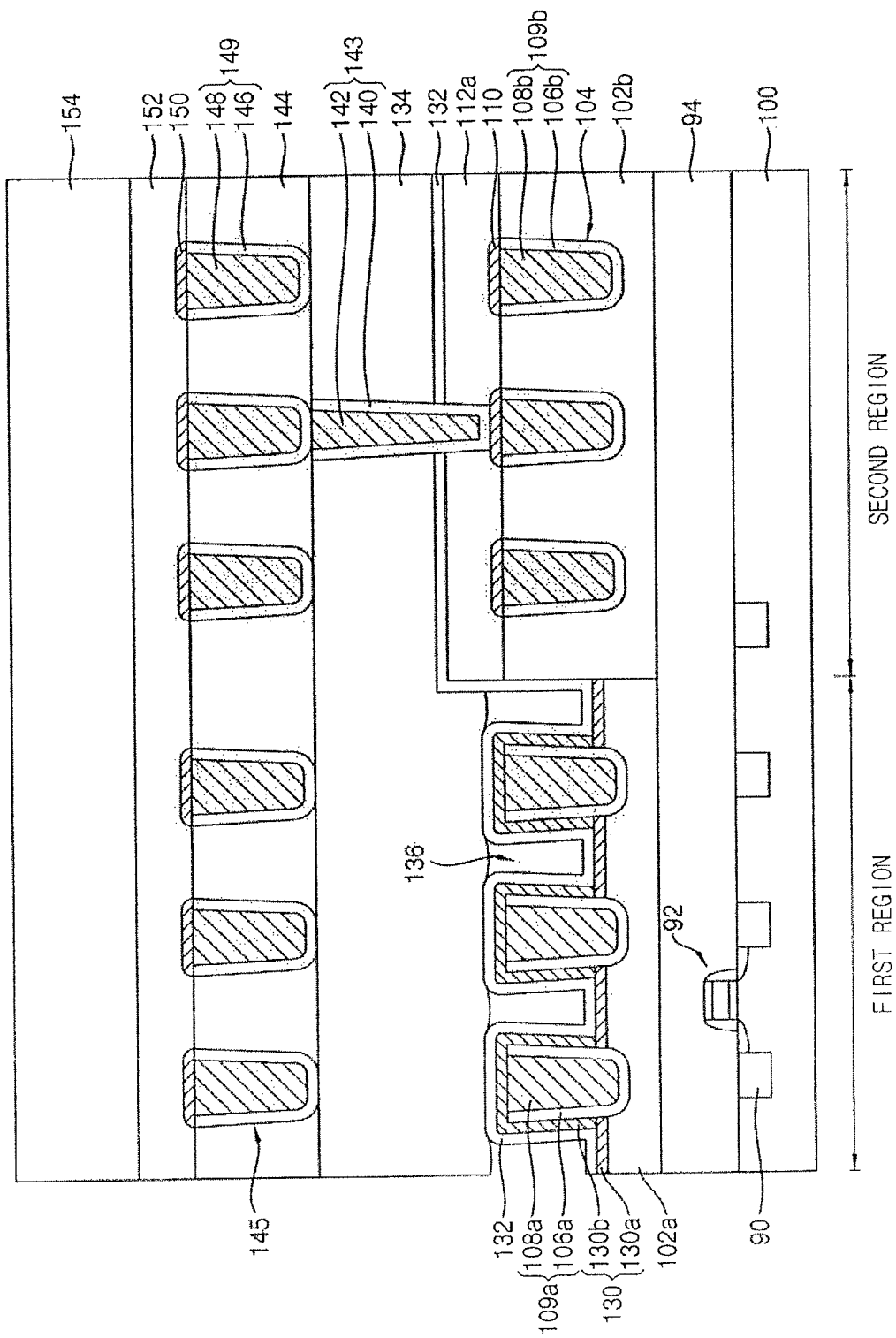
FIG. 17 illustrates a cross-sectional view of a semiconductor device in accordance with example embodiments.

FIG. 17 is a cross-sectional view illustrating a semiconductor device in accordance with example embodiments. The semiconductor device may include elements of the semiconductor device described with reference to FIG. 1, and further include other elements. Thus, like reference numerals refer to like elements, and detailed descriptions thereon are omitted herein.

Referring to FIG. 17, a lower structure may be formed on the substrate 100.

The first insulating interlayer 102a, the second insulating interlayer 102b, the third insulating interlayer 134, the first wiring structure 109a, the second wiring structure 109b, the contact plug 143, the first capping pattern 110, and the insulation capping structure 130 may be formed on the lower structure. A fourth insulating interlayer 144, a fifth insulating interlayer 154, and a third wiring structure 149 may be formed on the third insulating interlayer 134.

In example embodiments, the lower structure may include a unit device for a logic circuit. The lower structure may include, e.g., a transistor 92, a lower insulating interlayer 94, a lower wiring, etc. In example embodiments, an isolation pattern 90 may be formed on the substrate 100, and an active region and a field region of the substrate 100 may be defined by the isolation pattern 90. The transistor 92 may be formed on the substrate 100, and a lower insulating interlayer 94 may cover the transistor 92.

In example embodiments, a structure illustrated with reference to FIG. 1 may be formed on the lower structure. Alternatively, a structure illustrated with reference to FIG. 15 may be formed on the lower structure.

The fourth insulating interlayer 144 may be formed on the third insulating interlayer 134. The fourth insulating interlayer 144 may include an upper trench 145 thereon. The third wiring structure 149 may be formed in the upper trench 145. The third wiring structure 149 may extend in the first direction, and a plurality of third wiring structures 149 may be spaced apart from each other in the second direction. The fourth insulating interlayer 144 may fill a gap between the third wiring structures 149, so that no air gap may be formed adjacent to the third wiring structures 149. Some of the third wiring structures 149 may contact the contact plug 143.

In example embodiments, the third wiring structures 149 may be formed on the first and second regions of the substrate 100. Each of the third wiring structures 149 may include a fourth barrier pattern 146 and a fourth metal pattern 148.

The fourth capping pattern 150 may be formed on an upper surface of the third wiring structure 149. The fourth capping pattern 150 may not be formed on the fourth insulating interlayer 144. The fourth capping pattern 150 may include a conductive material, e.g., cobalt. The fourth capping pattern 150 may have a material substantially the same as a material of the first capping pattern 110.

A second capping mask layer 152 may be formed on the fourth capping pattern 150 and the fourth insulating interlayer 144. The second capping mask layer 152 may be formed of, e.g., SiCN, SiOC, SiN, SiOCN, etc. The second capping mask layer 152 may have a material substantially the same as a material of the first capping mask 112a. The fifth insulating interlayer 154 may be formed on the second capping mask layer 152.

As described above, the semiconductor device may include a plurality of wiring structures stacked in more than two levels. The first wiring structure 109a having the air gap at each of opposite sides thereof and the second wiring structure 109b having no air gap at opposite sides thereof may be formed at the same level. Also, the third wiring structure 149 having no air gap at each of opposite sides thereof may be formed on the first and second wiring structures 109a and 109b.

Figure 18:
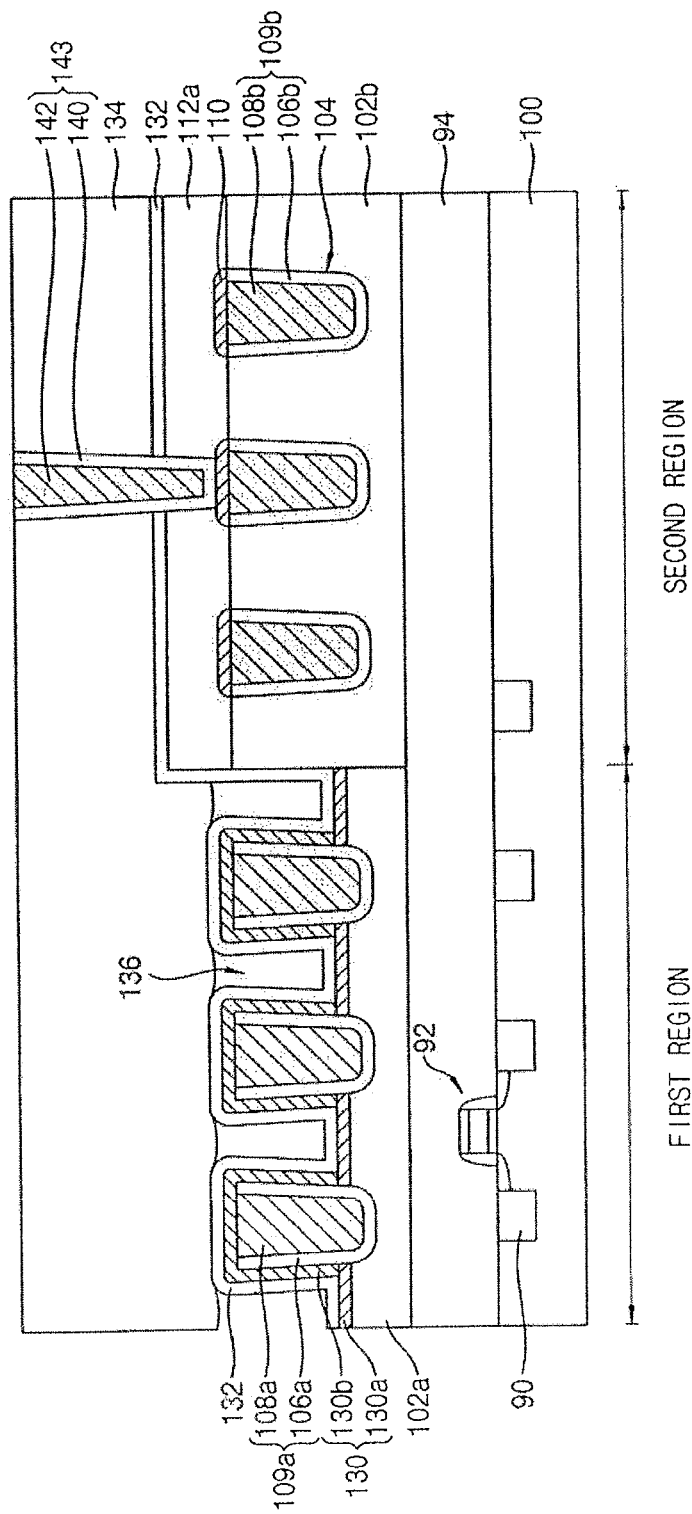
FIGS. 18 and 19 illustrate cross-sectional views of stages in a method of manufacturing a semiconductor device in accordance with example embodiments.
Figure 19:
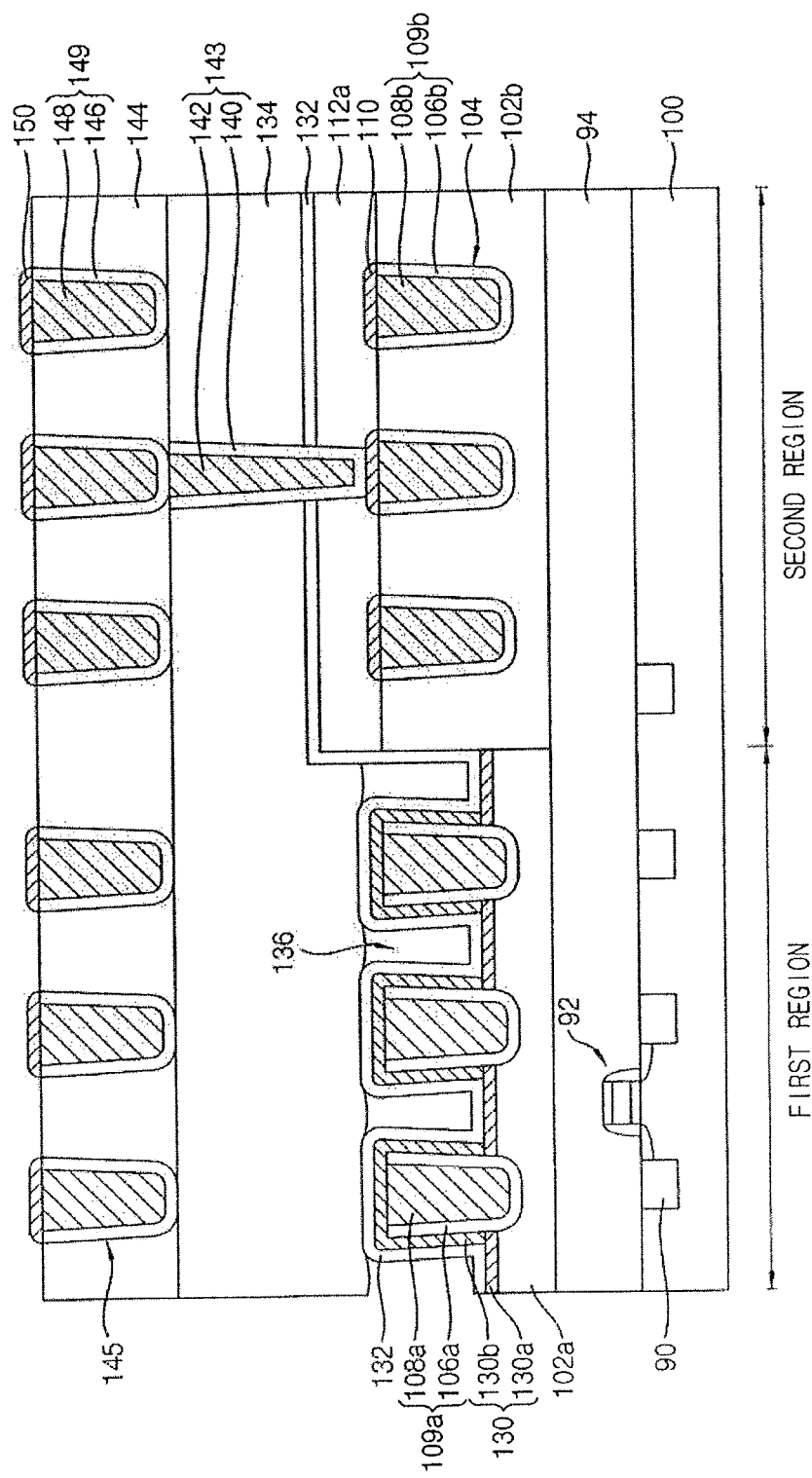

FIGS. 18 and 19 are cross-sectional views illustrating stages in a method of manufacturing a semiconductor device in accordance with example embodiments.

Referring to FIG. 18, the lower structure of FIG. 17 may be formed on the substrate 100.

In example embodiments, the isolation pattern 90 may be formed on the substrate 100, and an active region and a field region of the substrate 100 may be defined by the isolation pattern 90. The transistor 92 may be formed on the substrate 100, and the lower insulating interlayer 94 may be formed to cover the transistor 92. A lower wiring structure may be formed in the lower insulating interlayer.

In example embodiments, the processes illustrated with reference to FIGS. 2 to 14 may be performed to form the structure illustrated with reference to FIG. 1 on the lower structure. Alternatively, the processes illustrated with reference to FIG. 16 may be performed on the lower structure to form the structure illustrated with reference to FIG. 15 on the lower structure.

Referring to FIG. 19, the fourth insulating interlayer 144 may be formed on the third insulating interlayer 134. The fourth insulating interlayer 144 may be partially etched to form a plurality of upper trenches 145. Some of the upper trenches 145 may expose the contact plug 143.

The third wiring structure 149 including a fourth barrier pattern 146 and a fourth metal pattern 148 may be formed in each of the upper trenches 145. A process for forming the third wiring structure 149 may be substantially the same as the processes for forming the first and second wiring structures 109a and 109b illustrated with reference to FIG. 2.

The fourth capping pattern 150 may be formed on the third wiring structure 149. A process for forming the fourth capping pattern 150 may be substantially the same as the process for forming the first capping pattern 110 illustrated with reference to FIG. 3.

Referring to FIG. 17 again, a second capping mask layer 152 may be formed on the fourth insulating interlayer 144 and the fourth capping pattern 150. A process for forming the second capping mask layer 152 may be substantially the same as the process for forming the second capping layer illustrated with reference to FIG. 1. The fifth insulating interlayer 154 may be formed on the second capping mask layer 152.

Thus, a semiconductor device including a plurality of wiring structures stacked in more than two levels may be manufactured.

Figure 20:
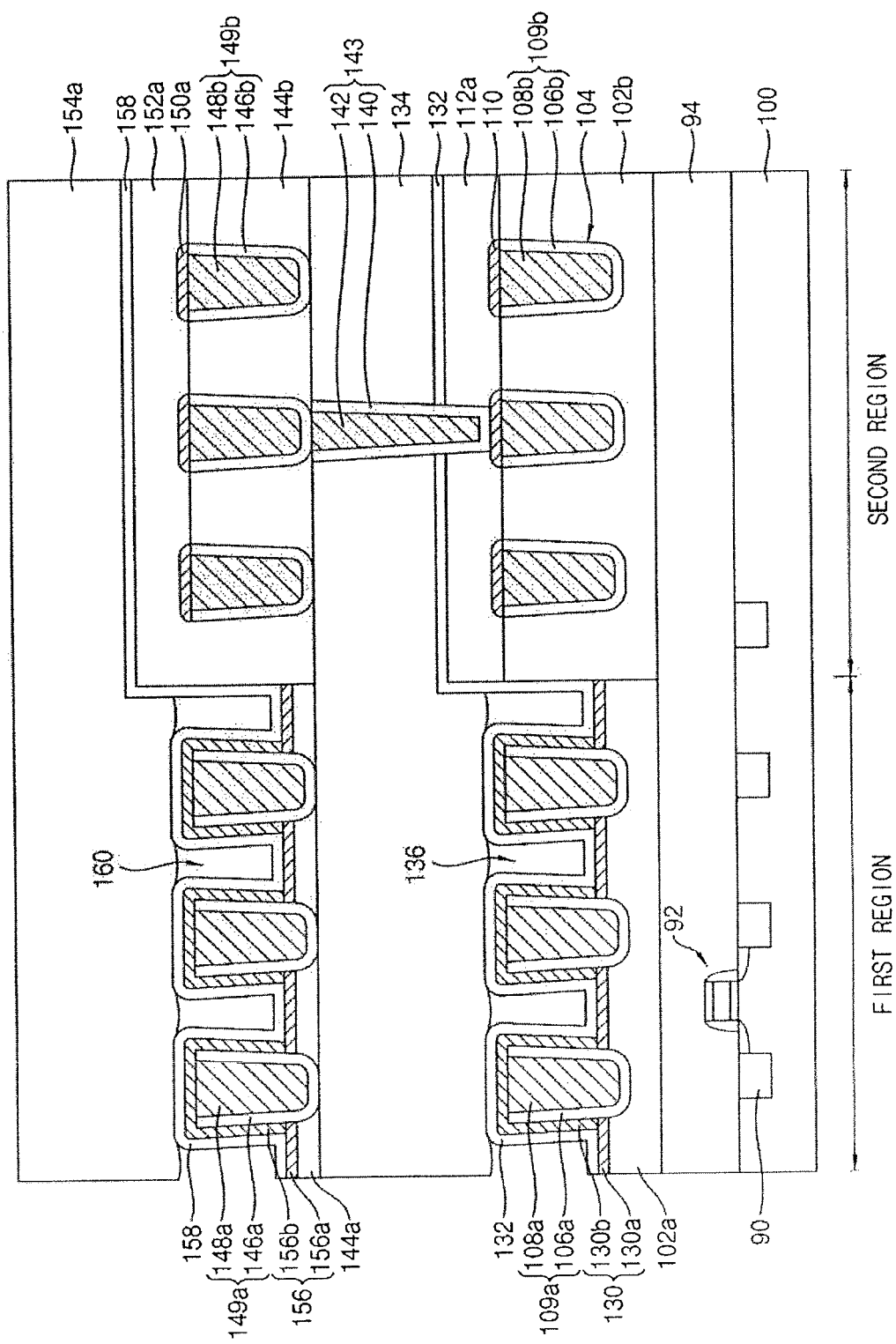
FIG. 20 illustrates a cross-sectional view of a semiconductor device in accordance with example embodiments.

FIG. 20 is a cross-sectional view illustrating a semiconductor device in accordance with example embodiments. The semiconductor device may include elements of the semiconductor device described with reference to FIG. 1, and further include other elements. Thus, like reference numerals refer to like elements, and detailed descriptions thereon are omitted herein.

Referring to FIG. 20, a lower structure may be formed a substrate.

The first insulating interlayer 102a, the second insulating interlayer 102b, the third insulating interlayer 134, the first wiring structure 109a, the second wiring structure 109b, the contact plug 143, the first capping pattern 110, and the insulation capping structure 130 may be formed on the lower structure. The fourth insulating interlayer 144a, the fifth insulating interlayer 144b, a sixth insulating interlayer 154a, the third wiring structure 149a, and a fourth wiring structure 149b may be formed on the third insulating interlayer 134.

The lower structure may include a unit device for forming a logic circuit. The lower structure may be substantially the same as that illustrated with reference to FIG. 17.

In example embodiments, a structure illustrated with reference to FIG. 1 may be formed on the lower structure. Alternatively, a structure illustrated with reference to FIG. 15 may be formed on the lower structure.

The fourth insulating interlayer 144a may be formed on a portion of the third insulating interlayer 134 overlapping the air gap portion, and the fifth insulating interlayer 144b may be formed on a portion of the third insulating interlayer 134 not overlapping the air gap portion.

A wiring structures illustrated with reference to FIG. 1 may be formed on the fourth insulating interlayer 144a and an upper portion and an inner portion of the fifth insulating interlayer 144b.

In detail, the third wiring structure 149a may be formed on the fourth insulating interlayer 144a, and the fourth wiring structure 149b may be formed on the fifth insulating interlayer 144b. The third wiring structure 149a may include a third barrier pattern 146a and a third metal pattern 148a, and the fourth wiring structure 149b may include a fourth barrier pattern 146b and a fourth metal pattern 148b. The third and fourth wiring structures 149a and 149b may have structures substantially the same as structures of the first and second wiring structures 109a and 109b, respectively.

A fourth capping pattern 150a may be formed on the fourth wiring structure 149b. The second capping mask 152a may be formed on the fifth insulating interlayer 144b and the fourth capping pattern 150a.

An upper insulation capping structure 156 may be formed on surfaces of the third wiring structure 149a and the fourth insulating interlayer 144a. The upper insulation capping structure 156 may include a fifth capping pattern 156a on the fourth insulating interlayer 144a and a sixth capping pattern 156b on the third wiring structure 149a. An upper liner layer 158 may be conformally formed on the upper insulation capping structure 156, the second capping mask 152a and a sidewall of the fifth insulating interlayer 144b.

Some of the fourth wiring structures 149b may contact the contact plug 143.

The sixth insulating interlayer 154a may be formed on the upper liner layer 158. A gap between the third wiring structures 149a may remain under the sixth insulating interlayer 154a. Thus, an upper air gap 160 may be formed between the third wiring structures 149a.

In example embodiments, the upper air gap 160 may be aligned with the first region in a vertical direction from an upper surface of the substrate 100. Alternatively, the upper air gap 160 may not be aligned with the first region in the vertical direction. That is, the upper air gap 160 may be aligned with the second region in the vertical direction.

As described above, the semiconductor device may include a plurality wiring structures stacked in more than two levels. The wiring structures may include the first and third wiring structures having the air gap at each of opposite sides thereof and the second and fourth wiring structures having no air gap at opposite sides thereof.

The semiconductor device may be manufactured by following processes. First, the processes illustrated with reference to FIGS. 18 and 19 may be performed to form a structure shown in FIG. 19. Then, the processes illustrated with reference to FIGS. 5 to 13 may be performed to form the semiconductor device shown in FIG. 20. As described above, the semiconductor device including a plurality of wiring structures stacked in more than two levels may be manufactured.

By way of summation and review, example embodiments provide a semiconductor device having a high reliability. Example embodiments also provide methods of manufacturing the semiconductor device having a high reliability.

That is, according to example embodiments, a semiconductor device may include an air gap among the first wiring structures, and a capping structure may, e.g., completely, cover the, e.g., exposed, surfaces of the first, e.g., copper, wiring structures and the insulating interlayer therebetween. Accordingly, as the capping structure is formed, moisture on the surface of the insulating interlayer may be removed, thereby the TDDB failure of the first wiring structure may be decreased. Also, as an upper surface of the first wiring structure is covered with the insulation capping structure, migration of metal out of the first wiring structure may decrease, thereby decreasing metal deterioration of the wiring structure. In addition, as the insulation capping structure is not formed on the second wiring structure, a contact plug may be easily formed on the second wiring structure by subsequent processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a preliminary first insulating interlayer on a first region and a second region of a substrate, the preliminary first insulating interlayer including a plurality of trenches thereon;
    forming first and second wiring structures filling the trenches on the first and second regions, respectively;
    etching a portion of the preliminary first insulating interlayer in the first region between the first wiring structures to form a first insulation interlayer between the first wiring structures in the first region;
    forming an insulation capping structure selectively only on a surface of the first insulating interlayer on the first region among the first and second regions, the insulation capping structure being between the first wiring structures and a sidewall and an upper surface of each of the first wiring structures, and the insulation capping structure including an insulating material; and
    forming a third insulating interlayer on the first and second wiring structures, such that an air gap is formed among the first wiring structures under the third insulating interlayer.

2. The method as claimed in claim 1, further comprising, after forming the first and second wiring structures, forming a first capping pattern including a conductive material on an upper surface of the second wiring structure.

3. The method as claimed in claim 1, further comprising, after forming the first and second wiring structures, forming a first capping mask on the preliminary first insulating interlayer on the second region to cover the second wiring structure.

4. The method as claimed in claim 3, wherein the first capping mask includes SiCN, SiOC, SiN, or SiOCN.

5. The method as claimed in claim 3, further comprising, forming a liner layer on the insulation capping structure and the first capping mask.

6. The method as claimed in claim 3, further comprising, after forming the third insulating interlayer, forming a contact plug through the third insulating interlayer and the first capping mask, such that the contact plug is electrically connected with the second wiring structure.

7. The method as claimed in claim 1, wherein the insulation capping structure includes an aluminum alloy, and the insulation capping structure is selectively deposited using the aluminum alloy on the surface of the first insulating interlayer between the first wiring structures and the sidewall and the upper surface of each of the first wiring structures.

8. The method as claimed in claim 7, wherein the insulation capping structure is formed by a chemical vapor deposition (CVD) process or an atomic layer deposition (ALD) process.

9. The method as claimed in claim 7, wherein the insulation capping structure includes a first capping pattern including aluminum oxynitride on the first insulating interlayer between the first wiring structures and a third capping pattern including aluminum nitride on the sidewall and the upper surface of each of the first wiring structures.

10. The method as claimed in claim 1, wherein etching a portion of the preliminary first insulating interlayer in the first region between the first wiring structures includes:
performing a plasma treatment of the preliminary first insulating interlayer in the first region between the first wiring structures to form a damaged portion; and
removing the damaged portion by wet etching process.

11. The method as claimed in claim 1, wherein etching a portion of the preliminary first insulating interlayer in the first region between the first wiring structures is performed by dry etching process.

12. A method of manufacturing a semiconductor device, the method comprising:
forming a first insulating interlayer on a first region of a substrate and a second insulating interlayer on a second region of the substrate;
forming a plurality of first wiring structures on the first insulating interlayer, the first wiring structures being spaced apart from each other;
forming a plurality of second wiring structures filling a plurality of trenches on the second insulating interlayer, respectively;
forming an insulation capping structure selectively only on a surface of the first insulating interlayer among the first and second insulating interlayers, the insulation capping structure being between the first wiring structures and on a sidewall and an upper surface of each of the first wiring structures, and the insulation capping structure including an insulating material; and
forming a third insulating interlayer on the first and second wiring structures, such that an air gap is formed among the first wiring structures under the third insulating interlayer.

13. The method as claimed in claim 12, wherein the insulation capping structure includes an aluminum alloy.

14. The method as claimed in claim 12, further comprising, forming a first capping pattern including a conductive material on the second wiring structure.

15. The method as claimed in claim 12, further comprising, forming a first capping mask covering the second insulating interlayer and the second wiring structure.

16. The method as claimed in claim 12, wherein upper surfaces of the first and second wiring structures and the second insulating interlayer are coplanar with each other.

17. A method of manufacturing a semiconductor device, the method comprising:
forming a preliminary first insulating interlayer on a first region and a second region of a substrate, the preliminary first insulating interlayer including a plurality of trenches thereon;
forming first and second wiring structures filling the trenches on the first and second regions, respectively;
forming a first capping mask on the preliminary first insulating interlayer on the second region to cover the second wiring structures;
etching a portion of the preliminary first insulating interlayer in the first region between the first wiring structures using the first capping mask as an etching mask to form a first insulation interlayer between the first wiring structures on the first region;
forming an insulation capping structure selectively only on a surface of the first insulating interlayer on the first region among the first and second regions, the insulation capping structure being between the first wiring structures and a sidewall and an upper surface of each of the first wiring structures, and the insulation capping structure including an insulating material; and
forming a third insulating interlayer on the first capping mask and the insulation capping structure to cover the first and second wiring structures, such that an air gap is formed among the first wiring structures under the third insulating interlayer.

18. The method as claimed in claim 17, wherein etching a portion of the preliminary first insulating interlayer in the first region between the first wiring structures includes:
performing a plasma treatment of the preliminary first insulating interlayer in the first region between the first wiring structures to form a damaged portion; and
removing the damaged portion by wet etching process.

19. The method as claimed in claim 17, wherein etching a portion of the preliminary first insulating interlayer in the first region between the first wiring structures is performed by dry etching process.

20. The method as claimed in claim 17, wherein the insulation capping structure includes an aluminum alloy.

* * * * *